United States Patent
Jinde et al.

(10) Patent No.: US 7,768,195 B2
(45) Date of Patent: Aug. 3, 2010

(54) ORGANIC ELECTROLUMINESCENT DEVICE WITH IMPROVED LUMINOUS EFFICIENCY

(75) Inventors: Yukitoshi Jinde, Sodegaura (JP); Hitoshi Kuma, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 642 days.

(21) Appl. No.: 11/475,081

(22) Filed: Jun. 27, 2006

(65) Prior Publication Data

US 2007/0273270 A1    Nov. 29, 2007

(30) Foreign Application Priority Data

May 25, 2006    (JP) .................... 2006-145983

(51) Int. Cl.
*H01J 1/62*    (2006.01)
(52) U.S. Cl. ...................... 313/504; 313/503
(58) Field of Classification Search ......... 313/498–512; 315/169.1, 169.3; 428/690–691, 917; 257/40, 257/72, 98–100, 642–643, 759; 427/66, 427/532–535, 539
See application file for complete search history.

(56) References Cited

U.S. PATENT DOCUMENTS

| | | | |
|---|---|---|---|
| 6,416,888 B1 * | 7/2002 | Kawamura et al. | 428/690 |
| 2002/0113545 A1 * | 8/2002 | Adachi et al. | 313/504 |
| 2002/0155319 A1 * | 10/2002 | Kawamura et al. | 428/690 |
| 2002/0168544 A1 * | 11/2002 | Fukuoka et al. | 428/690 |
| 2004/0032214 A1 * | 2/2004 | Lee et al. | 315/169.2 |
| 2005/0077817 A1 | 4/2005 | Yamazaki et al. | |
| 2005/0147844 A1 | 7/2005 | Hatwar et al. | |
| 2005/0158578 A1 * | 7/2005 | Iwakuma et al. | 428/690 |
| 2006/0012292 A1 * | 1/2006 | Kitamura et al. | 313/504 |
| 2006/0017376 A1 * | 1/2006 | Okinaka et al. | 313/504 |
| 2006/0061265 A1 * | 3/2006 | Kawamura et al. | 313/504 |
| 2006/0088729 A1 | 4/2006 | Begley et al. | |
| 2006/0172455 A1 * | 8/2006 | Winters et al. | 438/82 |

(Continued)

FOREIGN PATENT DOCUMENTS

EP    1 613 132 A1    1/2006

(Continued)

OTHER PUBLICATIONS

U.S. Appl. No. 11/475,225, filed Jun. 27, 2006, Jinde et al.

(Continued)

*Primary Examiner*—Joseph L Williams
*Assistant Examiner*—Fatima N Farokhrooz
(74) *Attorney, Agent, or Firm*—Oblon, Spivak, McClelland, Maier & Neustadt, L.L.P.

(57) ABSTRACT

An organic electroluminescent device (20) including an anode (1), a first emitting layer (3), a carrier barrier layer (4), a second emitting layer (5), and a cathode (7) stacked in that order. The first emitting layer (3) is formed of a hole transporting material, and the second emitting layer (5) is formed of an electron transporting material. The affinity level of the carrier barrier layer (4) is smaller than the affinity level of the second emitting layer (5) in an amount of 0.2 eV or more, and the ionization potential (Ie1) of the carrier barrier layer (4) and the ionization potential (Ih1) of the first emitting layer (3) satisfy $Ie1 < Ih1 + 0.1$ (eV) (1).

23 Claims, 7 Drawing Sheets

20: Organic EL Device
7: Cathode
6: Electron Transporting Layer
5: Second Emitting Layer
4: Carrier Barrier Layer
3: First Emitting Layer
2: Hole Transporting Layer
1: Anode

U.S. PATENT DOCUMENTS

| | | | |
|---|---|---|---|
| 2006/0175957 A1* | 8/2006 | Suzuri et al. | 313/504 |
| 2006/0257684 A1* | 11/2006 | Arakane et al. | 428/690 |
| 2006/0257687 A1* | 11/2006 | Hosokawa et al. | 428/690 |
| 2007/0111026 A1* | 5/2007 | Deaton et al. | 428/690 |
| 2007/0122651 A1* | 5/2007 | Igarashi | 428/690 |
| 2007/0145360 A1* | 6/2007 | Wang | 257/40 |

FOREIGN PATENT DOCUMENTS

| | | |
|---|---|---|
| EP | 1 667 494 A1 | 6/2006 |
| EP | 1 753 268 A1 | 2/2007 |
| JP | 8-78163 | 3/1996 |
| JP | 2003-272857 | 9/2003 |
| JP | 2004-235168 | 8/2004 |
| JP | 2005-100921 | 4/2005 |
| JP | 2005-150081 | 6/2005 |
| JP | 2005-276583 | 10/2005 |
| WO | WO 2004/060027 A1 | 7/2004 |
| WO | WO 2005/091685 A1 | 9/2005 |
| WO | WO 2005/099313 A1 | 10/2005 |
| WO | WO 2005/112518 A1 | 11/2005 |
| WO | WO2005112518 * | 11/2008 |

OTHER PUBLICATIONS

U.S. Appl. No. 11/521,317, filed Sep. 15, 2006, Jinde et al.
"Measurement of energy levels of BAlq, BCP and DTBT using cyclic voltammetry (CV)." Supplementary material (ESI) for Journal of Materials Chemistry, The Royal Society of Chemistry 2007, XP002502190, 4 pages.
Hosokawa et al, Appl. Phys. Letter, vol. 67, No. 26, 1995, p. 3853.
Data Book on Work Function of Organic Thin Films © C. Adachi, T. Oyamada, Y. Kanajima, 2004 ISBN4-88231-441-X.
Energy Star® Program Requirements for Solid State Lighting Luminaires, Eligibility Criteria—Version 1.1, Dec. 2008.
Wu et al, Thin Solid Films, vol. 488, (2005), pp. 265-269.
Lee et al, Materials Science and Engineering, vol. B95, (2002), pp. 24-28.

* cited by examiner

20: Organic EL Device
7: Cathode
6: Electron Transporting Layer
5: Second Emitting Layer
4: Carrier Barrier Layer
3: First Emitting Layer
2: Hole Transporting Layer
1: Anode Greater Ex: Example
CoEx: Comparative Example Ex: Example
CoEx: Comparative Example

ORGANIC ELECTROLUMINESCENT DEVICE WITH IMPROVED LUMINOUS EFFICIENCY

TECHNICAL FIELD

The invention relates to an organic electroluminescent device.

TECHNICAL BACKGROUND

Recently, white organic electroluminescent (EL) devices are being actively developed because they can be used for a mono-color display device, a lighting application such as a back light, and a full-color display with color filters. In the case where white organic EL devices are used for lighting applications, they are required to have a high luminous efficiency, for example, which is equivalent to or more than that of fluorescent lamps.

Many methods of producing white light emission by an organic EL device have been disclosed. Few of the methods produce white light with only one kind of emitting material and a single organic EL device generally uses two or three kinds of emitting materials that emit light simultaneously. In the case of using two kinds of emitting materials, a blue emitting material and a yellow-to-red emitting material, yellow-to-red being the complementary color to blue, are selected. However, the yellow-to-red light emission becomes dominant in many cases, thereby yielding a reddish white color.

Patent document 1 proposes a white device in the type where an emitting layer is divided into two layers, the emission zone of which tends to be localized to the anode side. The tendency for red to be strong in color of emitted light is negated by using a blue emitting layer as an emitting layer on the anode side, and whose color change is suppressed. The level of the luminous efficiency was, however, not necessarily enough.

Patent document 2 discloses an organic EL device in which a red emitting layer, a blue emitting layer, and a green emitting layer are stacked in that order from the anode side. The patent document 2 also discloses technology of reducing a change in color due to an increase in driving current by doping the blue emitting layer with a red dopant used for the red emitting layer. However, the luminous efficiency of this organic EL device is not necessarily satisfactory.

As technology of obtaining white light in a well-balanced manner, technologies of providing a carrier barrier layer between emitting layers have been disclosed.

For example, patent document 3 discloses an organic EL device which emits white light and in which an anode, a hole transporting blue emitting layer, an electron transporting carrier recombination region control layer, an electron transporting red emitting layer, and a cathode are stacked in that order. However, since the affinity level of the carrier recombination region control layer is larger than the affinity level of the hole transporting blue emitting layer, the organic EL device requires a high driving voltage. Moreover, since electrons are injected into the hole transporting blue emitting layer to a smaller extent as the driving time increases, the emission intensity of the hole transporting red emitting layer decreases, whereby the emission color tends to be biased to the red light from the electron transporting emitting layer.

Patent document 4 discloses a white organic EL device in which two electron transporting emitting layers are disposed through a carrier barrier layer. However, since holes injected from the anode are almost completely consumed by the first emitting layer, only a small number of holes are supplied to the second electron transporting emitting layer through the carrier barrier layer. As a result, white luminous efficiency is decreased.

Patent document 5 discloses a white organic EL device in which an anode, first emitting layer, carrier barrier layer, second emitting layer, and cathode are stacked in that order, wherein the ionization potential of the carrier barrier layer is greater than the ionization potential of the first emitting layer in an amount of 0.1 eV or more, and the affinity level of the carrier barrier layer is smaller than the affinity level of the second emitting layer in an amount of 0.1 eV or more. However, since the carrier barrier layer has functions of both an electron barrier and a hole barrier, the driving voltage is increased.

Patent document 6 discloses an organic EL device in which a red emitting layer, a green emitting layer, and a blue emitting layer are stacked in that order from the anode side, and a hole transporting and electron blocking intermediate layer is provided at least between the green emitting layer and the blue emitting layer. However, this organic EL device exhibits an insufficient luminous efficiency.

Patent document 7 discloses an organic EL device using a naphthacene derivative and a periflanthene derivative. However, this organic EL device exhibits an insufficient luminous efficiency.

[Patent document 1] JP-A-2003-272857
[Patent document 2] JP-A-2004-235168
[Patent document 3] JP-A-8-78163
[Patent document 4] WO2005/099313
[Patent document 5] WO2005/112518
[Patent document 6] JP-A-2005-100921
[Patent document 7] US-A-2006/0088729

In view of the above-described problems, an object of the invention is to provide an organic EL device which exhibits color rendition suitable for displays and lighting applications, exhibits high luminous efficiency, and shows only a small change in chromaticity.

DISCLOSURE OF THE INVENTION

The inventors of the invention have conducted extensive studies in order to achieve the above object. As a result, the inventors found that the following three organic EL devices exhibit high color rendition and high luminous efficiency and show only a small change in chromaticity. These findings have led to the completion of the invention.

(1) A device in which a carrier barrier layer is inserted between an organic emitting layer formed of a hole transporting material and an organic emitting layer formed of an electron transporting material, and the energy levels of these layers are appropriately controlled.

(2) A device in which a carrier barrier layer is inserted between an organic emitting layer formed of a hole transporting material and an organic emitting layer formed of an electron transporting material, and the organic emitting layer formed of the electron transporting material has a two-layer structure.

(3) The device according to (2), in which a carrier barrier layer is inserted between the two-layer organic emitting layers formed of the electron transporting material.

The invention provides the following organic EL device.

1. An organic electroluminescent device comprising:
an anode, a first emitting layer, a carrier barrier layer, a second emitting layer, and a cathode stacked in that order;
the first emitting layer being formed of a hole transporting material, and the second emitting layer being formed of an electron transporting material;

the affinity level of the carrier barrier layer being smaller than the affinity level of the second emitting layer in an amount of 0.2 eV or more; and the ionization potential (Ie1) of the carrier barrier layer and the ionization potential (Ih1) of the first emitting layer satisfying Ie1<Ih1+0.1 (eV) (1).

2. The organic electroluminescent device according to 1, wherein the energy gap of the first emitting layer is smaller than the energy gap of the second emitting layer in an amount of 0.4 eV or more.

3. The organic electroluminescent device according to 1 or 2, wherein the carrier barrier layer includes an emitting material.

4. The organic electroluminescent device according to any one of 1 to 3, further comprising a hole transporting layer adjacent to the first emitting layer between the anode and the first emitting layer.

5. The organic electroluminescent device according to 4, wherein a material forming the hole transporting layer is the same as a material forming the carrier barrier layer.

6. An organic electroluminescent device comprising:

an anode, a first emitting layer, a carrier barrier layer, a second emitting layer, a third emitting layer, and a cathode stacked in that order;

the first emitting layer being formed of a hole transporting material, and the second emitting layer and the third emitting layer being formed of electron transporting materials; and the ionization potential (Ie1) of the carrier barrier layer and the ionization potential (Ih1) of the first emitting layer satisfying the relationship Ie1<Ih1+0.1 (eV) (1).

7. The organic electroluminescent device according to 6, wherein the affinity level of the carrier barrier layer is smaller than the affinity level of the second emitting layer in an amount of 0.2 eV or more.

8. The organic electroluminescent device according to 6 or 7, wherein the energy gap of the first emitting layer is smaller than the energy gap of the second emitting layer in an amount of 0.4 eV or more.

9. The organic electroluminescent device according to any one of 6 to 8, wherein the carrier barrier layer comprises an emitting material.

10. The organic electroluminescent device according to any one of 6 to 9, further comprising a hole transporting layer adjacent to the first emitting layer between the anode and the first emitting layer.

11. The organic electroluminescent device according to 10, wherein a material forming the hole transporting layer is the same as a material forming the carrier barrier layer.

12. An organic electroluminescent device comprising:

an anode, a first emitting layer, a first carrier barrier layer, a second emitting layer, a second carrier barrier layer, a third emitting layer, and a cathode stacked in that order;

the first emitting layer being formed of a hole transporting material, and the second emitting layer and the third emitting layer being formed of electron transporting materials; and the ionization potential (Ie1) of the first carrier barrier layer and the ionization potential (Ih1) of the first emitting layer satisfying Ie1<Ih1+0.1 (eV) (1).

13. The organic electroluminescent device according to 12, wherein the affinity level of the first carrier barrier layer is smaller than the affinity level of the second emitting layer in an amount of 0.2 eV or more, and the affinity level of the second carrier barrier layer is smaller than the affinity level of the third emitting layer in an amount of 0.2 eV or more.

14. The organic electroluminescent device according to 12 or 13, wherein the energy gap of the first emitting layer is smaller than the energy gap of the second emitting layer in an amount of 0.4 eV or more.

15. The organic electroluminescent device according to any one of 12 to 14, wherein at least one of the first carrier barrier layer and the second carrier barrier layer comprises an emitting material.

16. The organic electroluminescent device according to any one of 12 to 15, further comprising a hole transporting layer adjacent to the first emitting layer between the anode and the first emitting layer.

17. The organic electroluminescent device according to 16, wherein a material forming the hole transporting layer is the same as a material forming at least one of the first carrier barrier layer and the second carrier barrier layer.

18. The organic electroluminescent device according to any one of 1 to 17, wherein the first emitting layer or a first organic layer which is the organic layer closer to the anode comprises an oxidizing agent and/or the second emitting layer or a second organic layer which is the organic layer closer to the cathode comprises a reducing agent.

According to the invention, an organic EL device can be provided which exhibits color rendition and high luminous efficiency and shows only a small change in chromaticity.

BEST MODE FOR CARRYING OUT THE INVENTION

First Embodiment

Figure 1:
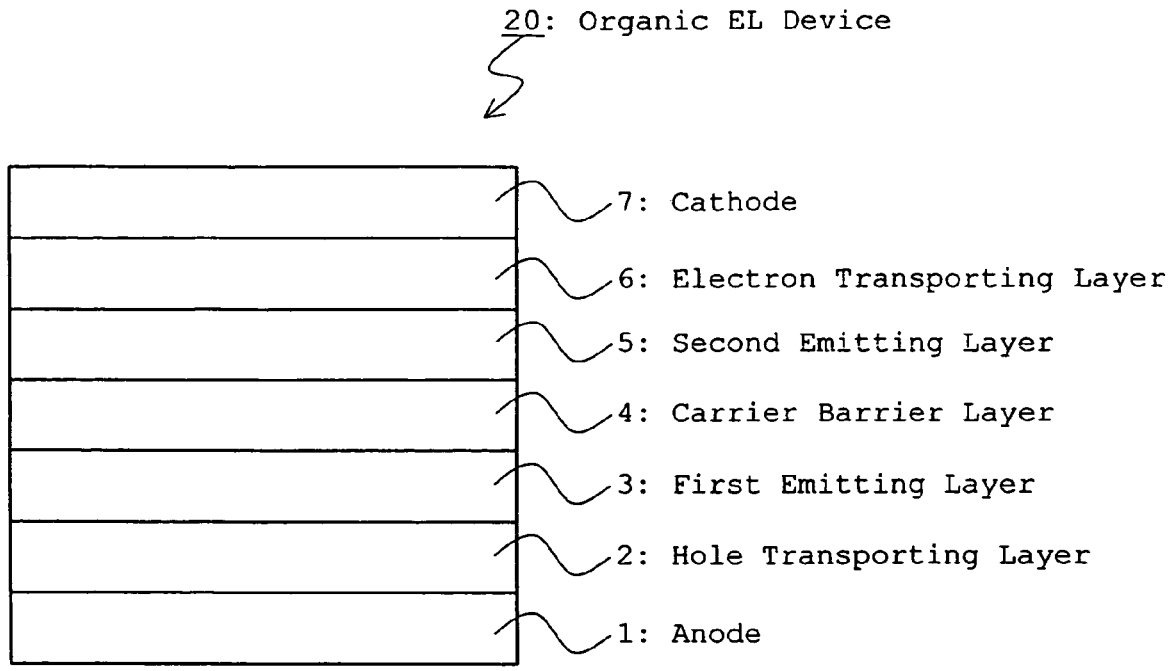
FIG. 1 is a view showing a configuration of an organic EL device according to an embodiment of the invention.

FIG. 1 is a view showing a configuration of an organic EL device according to a first embodiment of the invention.

An organic EL device 20 shown in FIG. 1 has a structure in which an anode 1, a hole transporting layer 2, a first emitting layer 3, a carrier barrier layer 4, a second emitting layer 5, an electron transporting layer 6, and a cathode 7 are stacked.

The organic EL device 20 can emit white light by allowing the first emitting layer 3 to emit red light and the second emitting layer 5 to emit blue light, for example.

In the organic EL device 20 according to this embodiment, the first emitting layer 3 on the anode 1 side is formed of a hole transporting material, and the second emitting layer 5 on the cathode 7 side is formed of an electron transporting material. This allows injection of electrons into the first emitting layer 3 and injection of holes into the second emitting layer 5 in a well-balanced manner. As a result, the recombination zone is concentrated on the periphery of the carrier barrier layer 4, whereby white light with an excellent color balance can be obtained with high efficiency.

The term "hole transporting" used in the invention means that the hole mobility of the layer is larger than the electron mobility in the electric field range of $10^2$ to $10^8$ V/cm. The hole mobility of the first emitting layer is preferably $10^{-5}$ cm$^2$/V·sec or more.

The term "electron transporting" used in the invention means that the electron mobility of the layer is larger than the hole mobility in the electric field range of $10^2$ to $10^8$ V/cm. The electron mobility of the second emitting layer is preferably $10^{-6}$ cm$^2$/V·sec or more.

The hole or electron mobility is measured using a time of flight method.

When the first emitting layer and the second emitting layer are formed of electron transporting materials, the recombination zone is localized to the first emitting layer in the same manner as in the patent document 4, whereby it is difficult to obtain excellent white light.

On the other hand, when the first emitting layer and the second emitting layer are formed of hole transporting materials, the recombination zone is localized to the second emitting layer, whereby it is difficult to obtain excellent white light. In the second emitting layer, the recombination zone tends to be localized to the cathode side. Therefore, the luminous efficiency decreases due to the quenching effect of the metal cathode.

When the first emitting layer is formed of an electron transporting material and the second emitting layer is formed of a hole transporting material, injection of electrons into the first emitting layer and injection of holes into the second emitting layer are hindered, whereby a significant increase in the driving voltage occurs.

In the organic EL device 20 according to this embodiment, the affinity level of the carrier barrier layer 4 is smaller than the affinity level of the second emitting layer 5 in an amount of 0.2 eV or more. The ionization potential (Ie1) of the carrier barrier layer 4 and the ionization potential (Ih1) of the first emitting layer 3 satisfy the following relationship (1).

$$Ie1 < Ih1 + 0.1 (eV) \tag{1}$$

This relationship is described below using a diagram showing the energy level.

Figure 2:
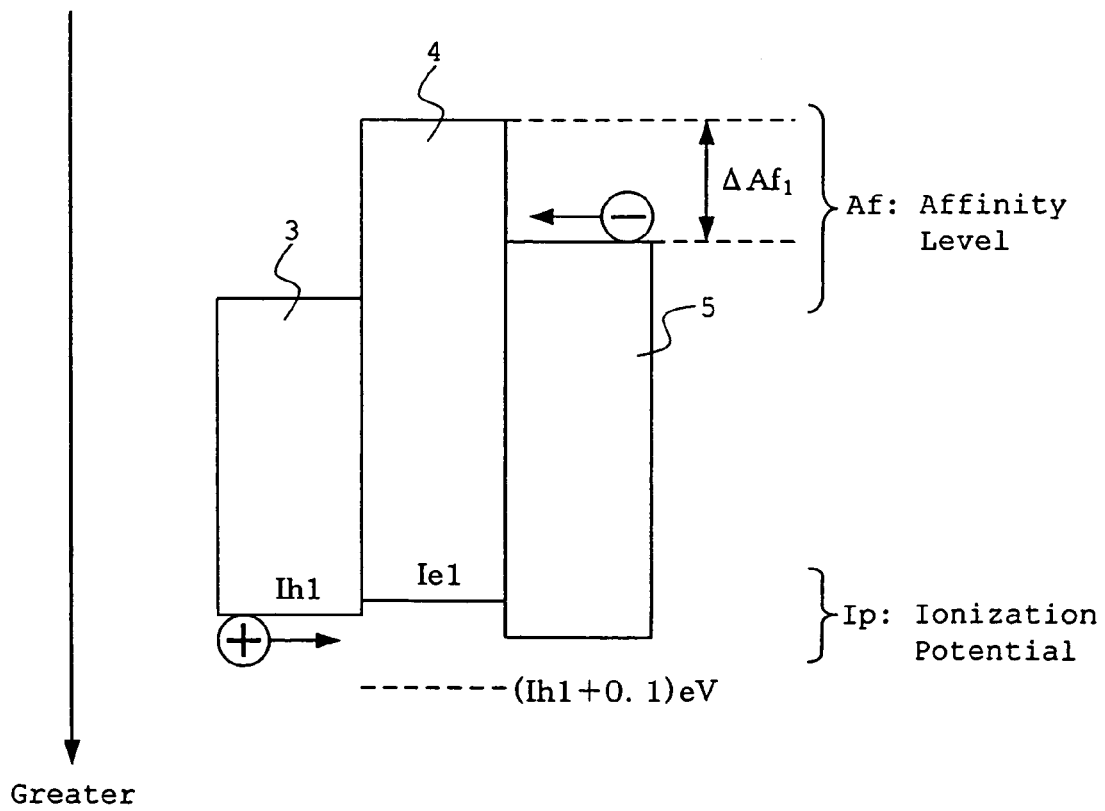
FIG. 2 is a view showing the energy levels of a first emitting layer, a carrier barrier layer, and a second emitting layer of the organic EL device shown in FIG. 1.

FIG. 2 shows the energy levels of the first emitting layer 3, the carrier barrier layer 4, and the second emitting layer 5 of the organic EL device 1. In FIG. 2, the level on the upper side indicates the affinity level of the each layer, and the level on the lower side indicates the ionization potential. In the energy level diagram, the value increases downward. The difference between the ionization potential and the affinity level of each layer corresponds to the energy gap.

In the organic EL device 20 according to this embodiment, the affinity level of the carrier barrier layer 4 is smaller than the affinity level of the second emitting layer 5 in an amount of 0.2 eV or more. In FIG. 2, the affinity level of the carrier barrier layer 4 is positioned above the affinity level of the second emitting layer 5 in an amount of 0.2 eV or more ($\Delta\Delta f_1$ in FIG. 2 is 0.2 eV or more).

The carrier barrier layer 4 is a layer which limits injection of electrons from the second emitting layer 5 on the cathode 7 side into the first emitting layer 3 on the anode 1 side, and is provided to control the amount of recombination of electron-hole pairs in each emitting layer to adjust the amount of light from each emitting layer. It is necessary for the carrier barrier layer 4 to have an affinity level smaller than the affinity level of the second emitting layer in an amount of 0.2 eV or more taking the above function into consideration. The carrier barrier layer 4 preferably has an affinity level smaller than the affinity level of the second emitting layer in an amount of 0.5 eV or more.

The relationship between the affinity level of the first emitting layer 3 and the affinity level of the carrier barrier layer 4 is not particularly limited. The carrier barrier layer 4 preferably has an affinity level smaller than the affinity level of the first emitting layer 3 in an amount of 0 eV or more.

In the organic EL device 20 according to this embodiment, the ionization potential (Ie1) of the carrier barrier layer 4 and the ionization potential (Ih1) of the first emitting layer 3 satisfy the above relationship (1). This aims at preventing a problem in which the carrier barrier layer 4 becomes a barrier for holes to increase the driving voltage.

The ionization potential (Ie1) of the carrier barrier layer 4 and the ionization potential (Ih1) of the first emitting layer 3 preferably satisfy the following expression (1').

$$Ie1 < Ih1 - 0.2 (eV) \tag{1'}$$

In the organic EL device 20 according to this embodiment, it is preferable that the energy gap of the first emitting layer 3 be smaller than the energy gap of the second emitting layer 5 in an amount of 0.4 eV or more. When the energy gap of the first emitting layer 3 is larger than the energy gap of the second emitting layer 5, or the energy gap of the first emitting layer 3 is smaller than the energy gap of the second emitting layer 5 in an amount of less than 0.4 eV, since the difference in affinity level between the second emitting layer 5 and the carrier barrier layer 4 becomes too large, the number of electrons supplied to the first emitting layer 3 becomes too small, whereby excellent white light may not be obtained. In more detail, it is preferable that the energy gap of the first emitting layer 3 be 1.8 to 2.8 eV and the energy gap of the second emitting layer 5 be 2.2 to 3.3 eV. This allows the first emitting layer 3 which emits red light and the second emitting layer 5 which emits blue light to satisfy the above requirement, so that well-balanced white light can be obtained.

The device configuration according to this embodiment is not limited to the configuration shown in FIG. 1. For example, the following configurations may also be employed.

1. Anode/first emitting layer/carrier barrier layer/second emitting layer/cathode 2. Anode/hole-transporting layer/first emitting layer/carrier barrier layer/second emitting layer/cathode 3. Anode/first emitting layer/carrier barrier layer/second emitting layer/electron transporting layer/cathode 4. Anode/hole transporting layer/first emitting layer/carrier barrier layer/second emitting layer/electron transporting layer/cathode 5. Anode/hole injecting layer/hole transporting layer/first emitting layer/carrier barrier layer/second emitting layer/electron transporting layer/cathode 6. Anode/hole injecting layer/hole transporting layer/first emitting layer/carrier barrier layer/second emitting layer/electron transporting layer/electron injecting layer/cathode Of these, the configurations including a hole transporting layer are preferable.

Another organic layer or inorganic layer may be inserted in addition to the above layers. The inserted layer is not limited insofar as the layer can transport electrons and holes. When the inserted layer is provided in the light-outcoupling direction, the layer is preferably transparent.

A plurality of carrier barrier layers may be stacked. In this case, it suffices that the carrier barrier layer positioned closest to the anode satisfy the above relationship (1), and the carrier barrier layer positioned closest to the cathode have an affinity level smaller than the affinity level of the second emitting layer in an amount of 0.2 eV.

Second Embodiment

Figure 3:
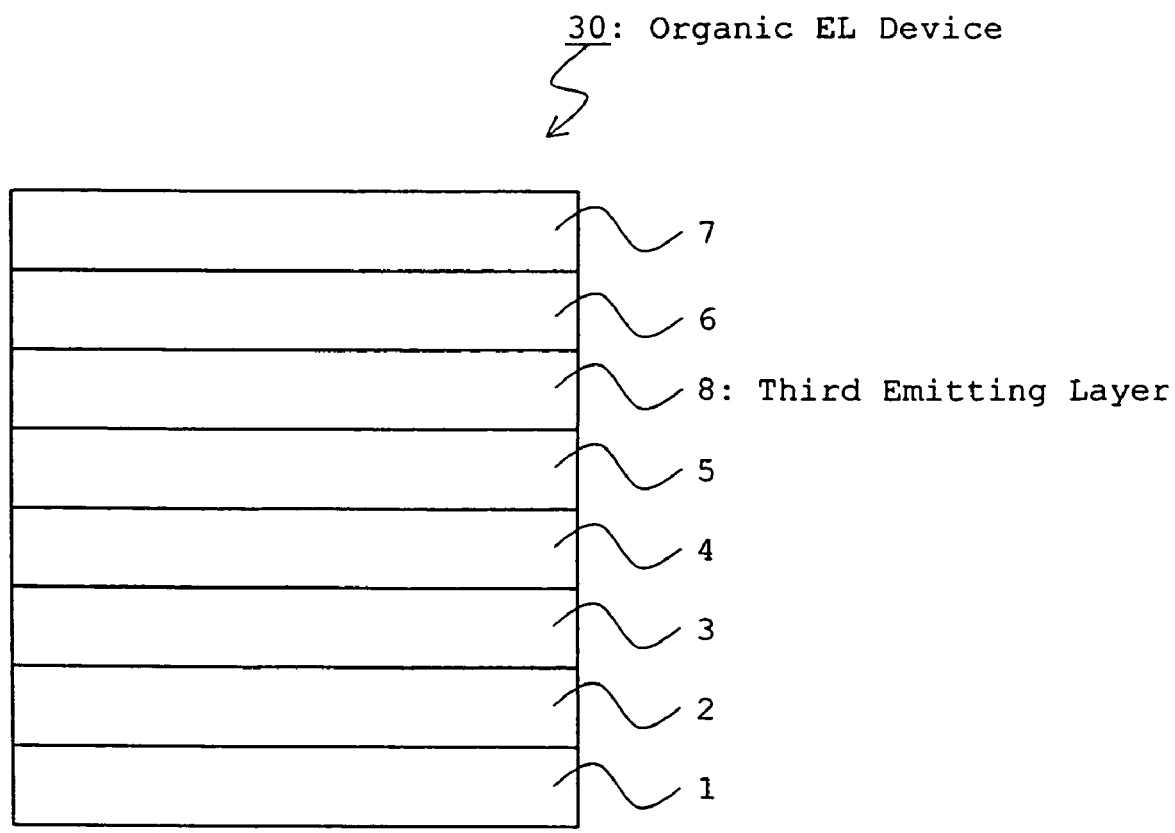
FIG. 3 is a view showing a configuration of an organic EL device according to another embodiment of the invention.

FIG. 3 is a view showing a configuration of an organic EL device according to a second embodiment of the invention.

An organic EL device 30 shown in FIG. 3 has a structure in which the anode 1, the hole transporting layer 2, the first emitting layer 3, the carrier barrier layer 4, the second emitting layer 5, a third emitting layer 8, the electron transporting layer 6, and the cathode 7 are stacked. Specifically, the organic EL device 30 has the same configuration as in the first embodiment except that the third emitting layer 8 is additionally formed. The third emitting layer 8 is formed of an electron transporting material in the same manner as the second emitting layer 5.

The organic EL device 30 can emit white light with more excellent color rendition by allowing the first emitting layer 3 to emit red light, the second emitting layer 5 to emit blue light, and the third emitting layer 8 to emit green light, for example.

In this embodiment, the first emitting layer 3, the carrier barrier layer 4, and the second emitting layer 5 need not necessarily have the relationship described in the first embodiment. This is because the number of electrons injected into the first emitting layer 3, the carrier barrier layer 4, and the second emitting layer 5 is limited by forming the third emitting layer 8.

In order to improve the performance of the device, it is preferable that the ionization potentials, affinity levels, and energy gaps of the first emitting layer 3, the carrier barrier layer 4, and the second emitting layer 5 have the same relationship as in the first embodiment.

The device configuration according to this embodiment is not limited to the configuration shown in FIG. 3. For example, configurations in which the third emitting layer 6 is formed in the device configurations 1 to 6 illustrated in the first embodiment 1 may be employed, or a plurality of carrier barrier layers may be stacked.

Third Embodiment

Figure 4:
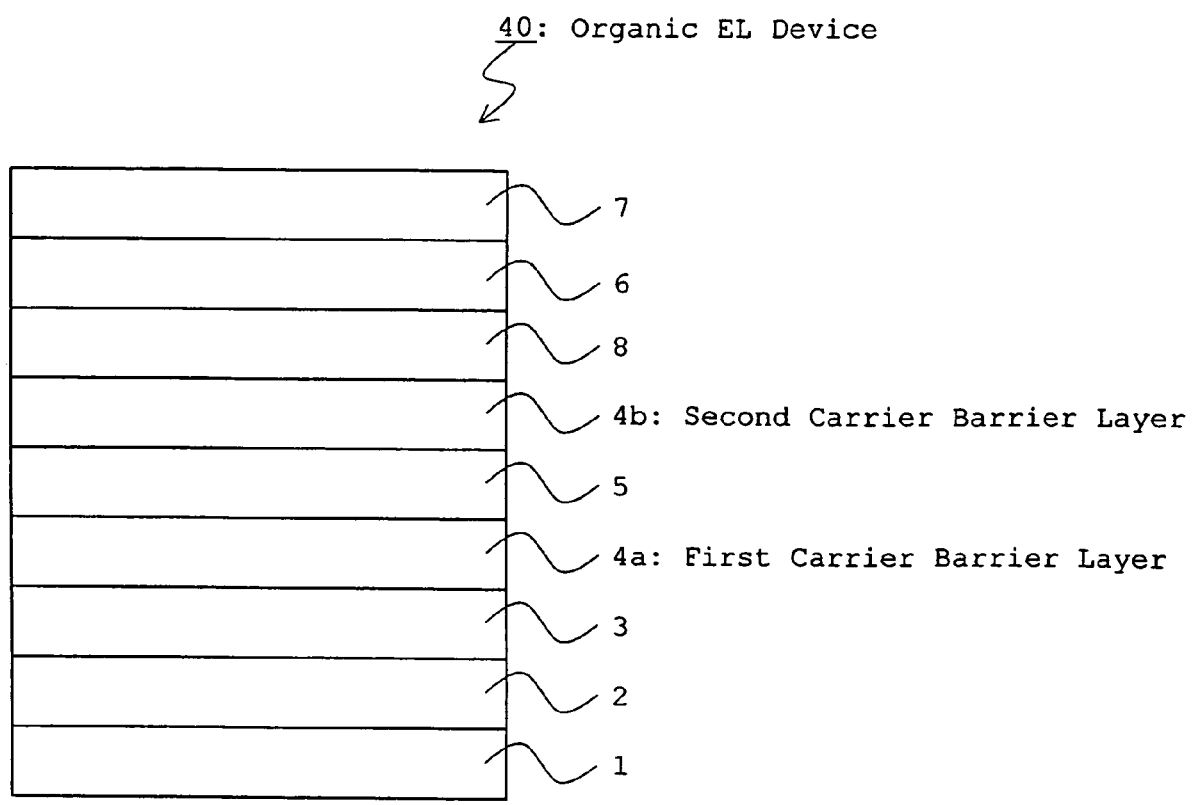
FIG. 4 is a view showing a configuration of an organic EL device according to still another embodiment of the invention.
Figure 5:
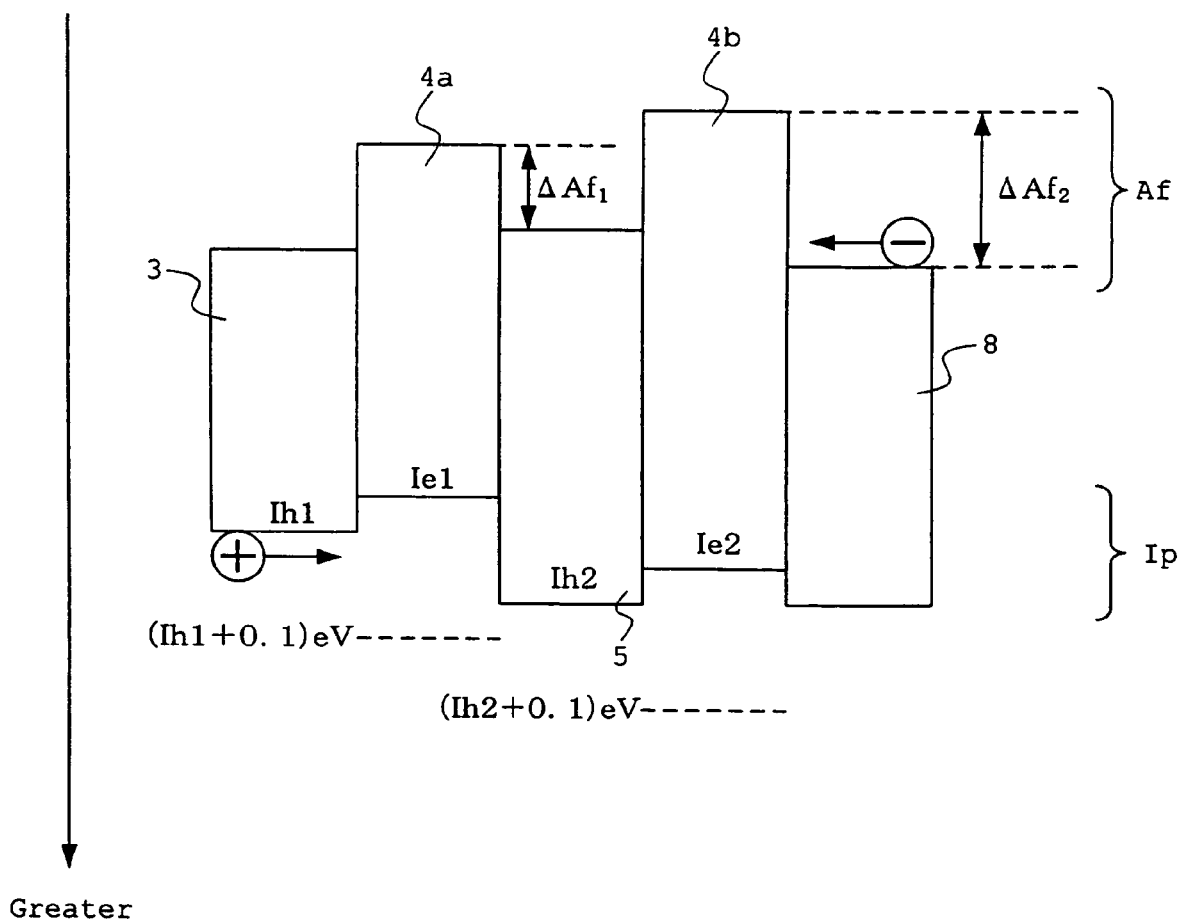
FIG. 5 is a view showing the energy levels of a first emitting layer, first carrier barrier layer, second emitting layer, second carrier barrier layer, and third emitting layer of the organic EL device shown in FIG. 4.

FIG. 4 is a view showing a configuration of an organic EL device according to a third embodiment of the invention. FIG. 5 is a view showing the energy levels of the first emitting layer, first carrier barrier layer, second emitting layer, second carrier barrier layer, and third emitting layer of this organic EL device.

An organic EL device 40 shown in FIG. 4 has a structure in which the anode 1, the hole transporting layer 2, the first emitting layer 3, a first carrier barrier layer 4a, the second emitting layer 5, a second carrier barrier layer 4b, the third emitting layer 8, the electron transporting layer 6, and the cathode 7 are stacked. Specifically, the organic EL device 40 has the same configuration as in the second embodiment except that the second carrier barrier layer 4b is additionally formed.

It is possible to cause the second emitting layer 5 and the third emitting layer 8 to emit light in a well-balanced manner by forming the second carrier barrier layer 4b between the second emitting layer 5 and the third emitting layer 8. Therefore, the luminous balance of the three emitting layers in the device can be easily controlled.

The organic EL device 40 can emit white light with an excellent color rendition by allowing the first emitting layer 3 to emit red light, the second emitting layer 5 to emit blue light, and the third emitting layer 8 to emit green light, for example.

In this embodiment, the first emitting layer 3, the first carrier barrier layer 4a, and the second emitting layer 5 need not necessarily have the relationship described in the first embodiment. This is because the number of electrons injected into the first emitting layer 3, the first carrier barrier layer 4a, and the second emitting layer 5 is limited by forming the second carrier barrier layer 5b.

In order to improve the performance of the device, it is preferable that the ionization potentials, affinity levels, and energy gaps of the first emitting layer 3, the first carrier barrier layer 4a, and the second emitting layer 5 have the same relationship as in the first embodiment.

In the organic EL device 40 according to this embodiment, it is preferable that the affinity level of the second carrier barrier layer 4b be smaller than the affinity level of the third emitting layer 8 in an amount of 0.2 eV or more ($\Delta Af_2$ in FIG. 5 is 0.2 eV or more) for the same reasons as in the first embodiment. The second carrier barrier layer 4b more preferably has an affinity level smaller than the affinity level of the third emitting layer 8 in an amount of 0.5 eV or more.

It is also preferable that the ionization potential (Ie2) of the second carrier barrier layer 4b and the ionization potential (Ih2) of the second emitting layer 5 satisfy the following relationship (2).

$$Ie2 < Ih2 + 0.1 (eV) \quad (2)$$

The device configuration according to this embodiment is not limited to the configuration shown in FIG. 4 like the first and second embodiments. For example, configurations in which the third emitting layer 8 and the second carrier barrier layer 4b are formed in the device configurations 1 to 6 illustrated in the first embodiment 1 may be employed. Each of the first carrier barrier layer 4a and the second carrier barrier layer 4b may be formed by stacking a plurality of carrier barrier layers.

The embodiments of the invention have been described above. In the device according to the invention, the anode, the hole transporting first emitting layer, the carrier barrier layer, the electron transporting second emitting layer, and the cathode are stacked in that order. This configuration allows an organic EL device to be obtained which exhibits color rendition and high luminous efficiency and shows only a small change in chromaticity. The device according to the invention has a feature in which a change in chromaticity of emitted light is small even if the driving conditions (e.g. driving voltage) of the device are changed.

The carrier barrier layer, the hole transporting first emitting layer, and the electron transporting second emitting layer (third emitting layer), which are the characteristic portions of the invention, are mainly described below. The configurations and the production methods of another organic layer, inorganic compound layer, anode, cathode, and the like may be those generally used in the art.

1. Carrier Barrier Layer

The hole mobility of a carrier barrier layer is preferably at least $10^{-5}$ cm$^2$/V·second when an electric field of $10^4$ to $10^6$ V/cm is applied since the carrier barrier layer is less apt to be a barrier against holes.

Although not specially limited, the thickness of the carrier barrier layer is preferably 0.1 to 50 nm, more preferably 0.1 to 10 nm.

For the carrier barrier-layer, various organic compounds and inorganic compounds can be used. The organic compounds include tertiary amine compounds, carbazole derivatives, compounds containing a nitrogen-containing heterocycle and metal complexes. The inorganic compounds include oxides, nitrides, composite oxides, sulfides and fluorides of metals such as Ba, Ca, Sr, Yb, Al, Ga, In, Li, Na, K, Cd, Mg, Si, Ta, Ge, Sb, Zn, Cs, Eu, Y, Ce, W, Zr, La, Sc, Rb, Lu, Ti, Cr, Ho, Cu, Er, Sm, W, Co, Se, Hf, Tm, Fe and Nb.

In particular, the organic compounds mentioned below, which are usually used for a hole transporting layer in an organic EL device, are preferably used since the carrier barrier layer is less apt to be a barrier against holes.

Specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

The following can also be used: porphyrin compounds (disclosed in JP-A-63-2956965 and others), aromatic tertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others). Aromatic tertiary amine compounds are preferably used.

Further, compounds represented by the following formula [1] are also preferred.

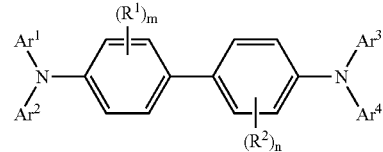

[1]

wherein $Ar^1$ to $Ar^4$ are independently a substituted or unsubstituted aryl group with 6 to 50 nucleus carbon atoms, $R^1$ and $R^2$ are independently a hydrogen atom, a substituted and unsubstituted aryl group with 6 to 50 nucleus carbon atoms or an alkyl group with 1 to 50 carbon atoms; and m and n are an integer of 0 to 4.

Examples of the aryl group with 6 to 50 nucleus carbon atoms preferably include phenyl, naphthyl, biphenyl, terphenyl and phenanthryl group. The aryl group with 6 to 50 nucleus carbon atoms may be substituted by a substituent. As preferable examples of the substituent, alkyl groups with 1 to 6 carbon atoms (methyl, ethyl, isopropyl, n-propyl, s-butyl, t-butyl, pentyl, hexyl, cyclopentyl, cyclopentyl and the like) and amino groups substituted by an aryl group with 6 to 50 nucleus carbon atoms can be given. As examples of the alkyl group with 1 to 50 carbon atoms, methyl, ethyl, isopropyl, n-propyl, s-butyl, t-butyl, pentyl, hexyl, cyclopentyl, cyclohexyl and the like are preferable.

The following can also be given as examples: 4,4'-bis(N-(1-naphthyl)-N-phenylamino)biphenyl (NPD), which has in the molecule thereof two condensed aromatic rings, disclosed in U.S. Pat. No. 5,061,569, and 4,4',4''-tris(N-(3-methylphenyl)-N-phenylamino)triphenylamine (MTDATA), wherein three triphenylamine units are linked in a star-burst form, disclosed in JP-A-4-308688.

An emitting material may be added to a carrier barrier layer, thereby obtaining emission containing various light components. For example, with respect to white light, light having excellent coloring rendition can be obtained. As the emitting materials, the dopants used for each emitting layer described later can be used.

2. First Emitting Layer Formed of Hole Transporting Material

The hole mobility of the first emitting layer is larger than the electron mobility thereof in the electric field range of $10^2$ to $10^8$ V/cm in view of the above-mentioned mobility relationship.

For color of emitted light, the first emitting layer is preferably yellow-to-orange or red emitting layer in view of the energy gap relationship. The yellow-to-orange or red emitting layer is a layer which emits light having a maximum wavelength of 550 to 650 nm. The emitting layer contains a host material and a yellow-to-orange or red dopant. The hole mobility of the host material is preferably at least $10^{-5}$ cm$^2$/V·second or more when an electric field of $10^4$ to $10^6$ V/cm is applied.

The host material is preferably a compound with an energy gap of 2.8 eV or less represented by the following formula [2].

$$X—(Y)_n \qquad [2]$$

wherein X is a condensed aromatic ring group with two or more carbocycles, Y is a group selected from substituted or unsubstituted aryl, substituted or unsubstituted diarylamino, substituted or unsubstituted arylalkyl and substituted or unsubstituted alkyl groups, and n is an integer of 1 to 6, provided that Ys may be the same or different when n is 2 or more.

X is preferably a group containing at least one skeleton selected from naphthacene, pyrene, anthracene, perylene, chrysene, benzoanthracene, pentacene, dibenzoanthracene, benzopyrene, benzofluorene, fluoranthene, benzofluoranthene, naphthylfluoranthene, dibenzofluorene, dibenzopyrene, dibenzofluoranthene and acenaphtylfluoranthene; and more preferably a group containing a naphthacene skeleton or anthracene skeleton.

Y is preferably an aryl group or a diarylamino group with 12 to 60 carbon atoms, more preferably an aryl group with 12 to 20 carbon atoms or a diarylamino group with 12 to 40 carbon atoms. n is preferably 2.

The first emitting layer of the organic EL device of the invention preferably contains, as a compound represented by formula [2], one or more kinds of compounds selected from a naphthacene derivative, a diaminoanthracene derivative, a naphthofluoranthene derivative, a diaminopyrene derivative, a diaminoperylene derivative, an aminoanthracene derivative, an aminopyrene derivative or a dibenzochrysene derivative. The layer more preferably contains a naphthacene derivative or a diaminoanthracene derivative.

The naphthacene derivative is represented by the following formula [3].

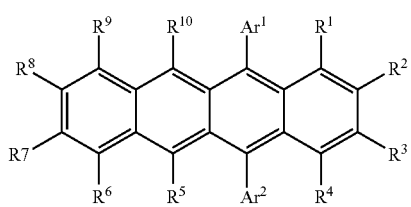

[3]

wherein $Ar^1$ and $Ar^2$ are not the same as each other, and a substituted or unsubstituted aromatic group with 6 to 50 nucleus carbon atoms; and $R^1$ to $R^{10}$ are each independently a hydrogen atom, a substituted or unsubstituted aromatic group with 6 to 50 nucleus carbon atoms or a substituted or unsubstituted alkyl group with 1 to 50 carbon atoms.

The naphthacene derivative represented by the formula [3] is more preferably represented by the following formula [4].

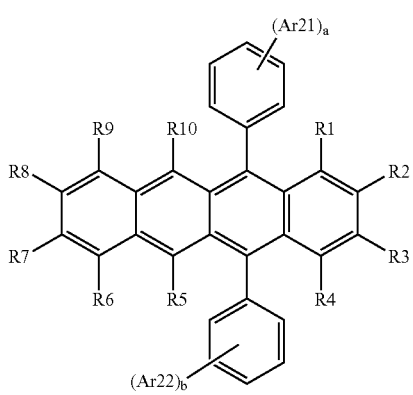

[4]

wherein Ar21 and Ar22 are each independently a substituted or unsubstituted aromatic group with 6 to 50 nucleus carbon atoms; R1 to R10 are each independently a hydrogen atom, a substituted or unsubstituted aromatic group with 6 to 50 nucleus carbon atoms or a substituted or unsubstituted alkyl group with 1 to 50 carbon atoms; and a and b are each an integer of 0 to 5.

There can be used as a yellow-to-orange or red dopant a florescent compound containing at least one of a fluoranthene skeleton and a perylene skeleton. Examples thereof include compounds represented by the following formulas [5] to [21].

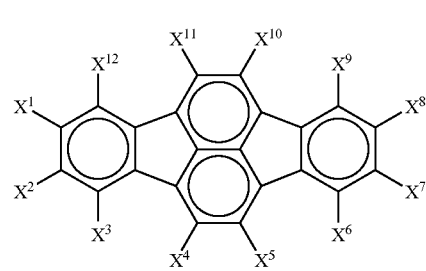

[5]

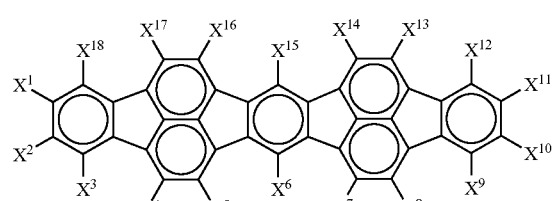

[6]

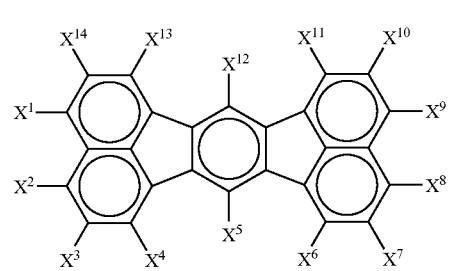

[7]

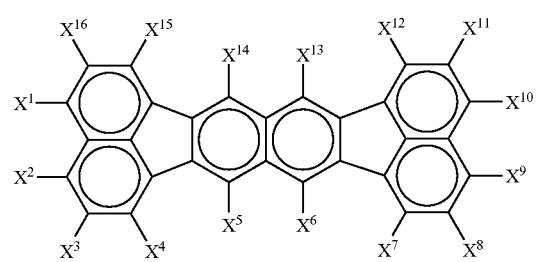

[8]

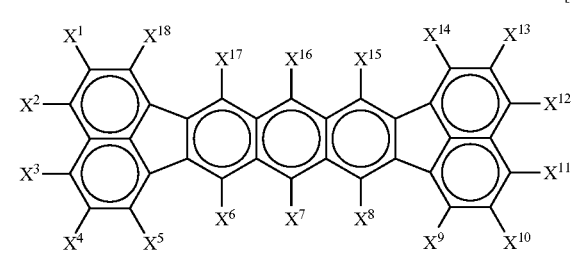

[9]

-continued

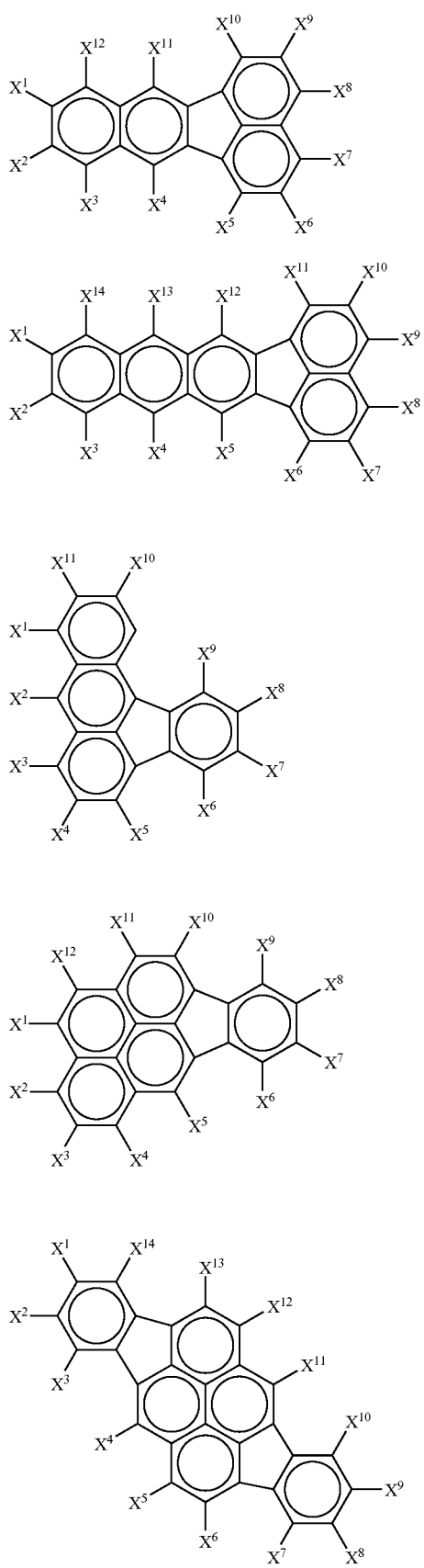

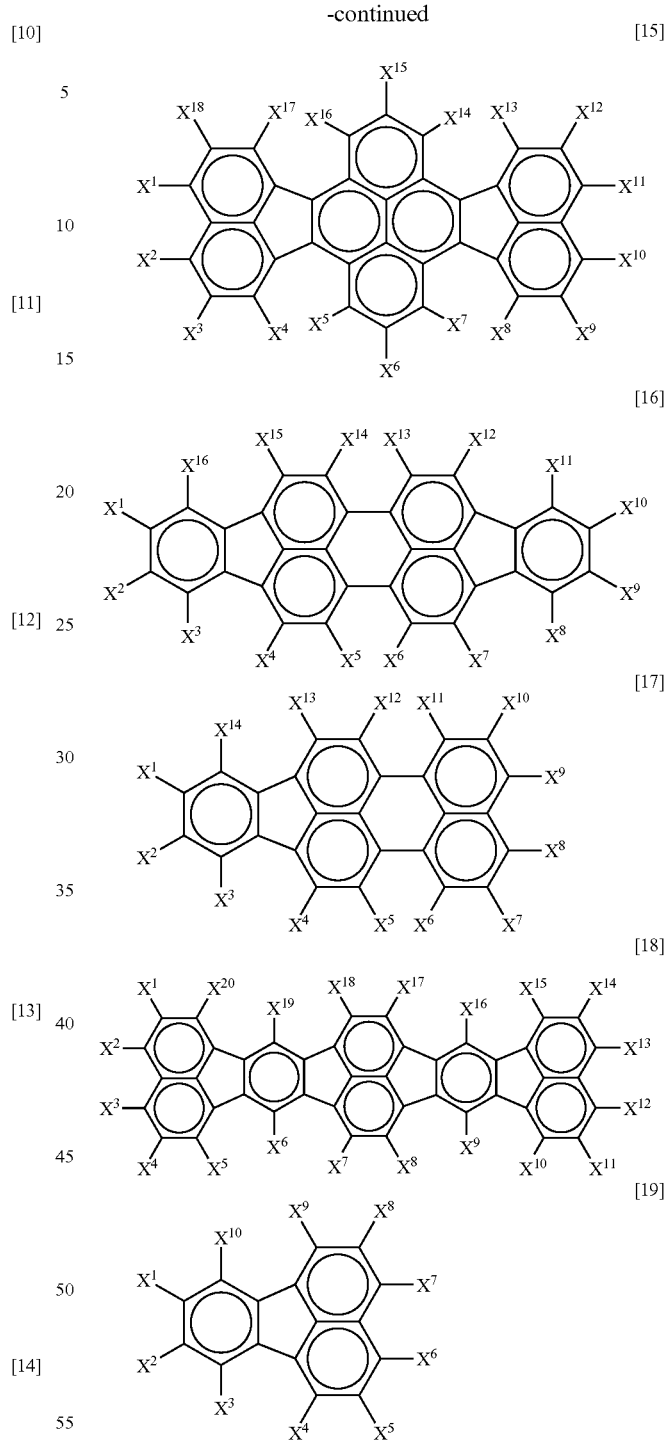

wherein $X^1$ to $X^{20}$ are independently a hydrogen atom; a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; adjacent substituents and $X^1$ to $X^{20}$ may be bonded together to form a ring structure; and when adjacent substituents are an aryl group, the substituents may be the same.

The compounds of the formulas [5] to [19] preferably contain an amino group or an alkenyl group.

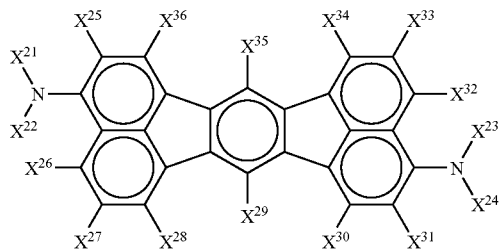

[20]

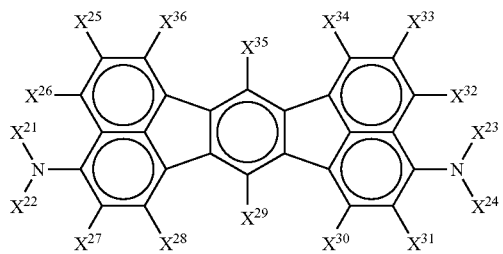

[21]

wherein $X^{21}$ to $X^{24}$ are independently an alkyl group with 1 to 20 carbon atoms, a substituted or unsubstituted aryl group with 6 to 30 carbon atoms; $X^{21}$ and $X^{22}$ and/or $X^{23}$ and $X^{24}$ may be bonded to each other with a carbon to carbon bond, —O— or —S— therebetween;

$X^{25}$ to $X^{36}$ are independently a hydrogen atom, a linear, branched or cyclic alkyl group with 1 to 20 carbon atoms, a linear, branched or cyclic alkoxy group with 1 to 20 carbon atoms, a substituted or unsubstituted aryl group with 6 to 30 carbon atoms, a substituted or unsubstituted aryloxy group with 6 to 30 carbon atoms, a substituted or unsubstituted arylamino group with 6 to 30 carbon atoms, a substituted or unsubstituted alkylamino group with 1 to 30 carbon atoms, a substituted or unsubstituted arylalkylamino group with 7 to 30 carbon atoms or a substituted or unsubstituted alkenyl group with 8 to 30 carbon atoms; and adjacent substituents and $X^{25}$ to $X^{36}$ may be bonded together to form a ring structure. At least one of the substituents $X^{25}$ to $X^{36}$ in each of the formulas preferably contains an amino or alkenyl group.

The compound containing a fluoranthene or perylene skeleton is preferably a indenoperylene derivative represented by the following formula [22] or [23].

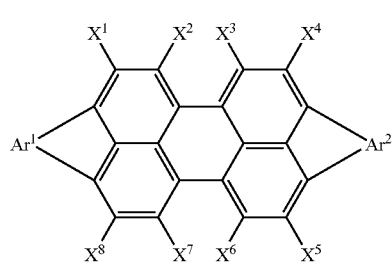

[22]

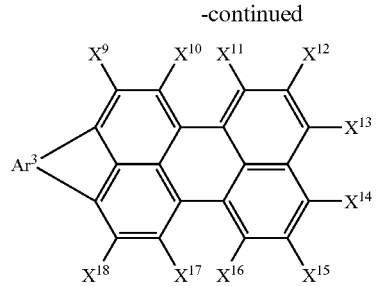

[23]

wherein $Ar^1$, $Ar^2$ and $Ar^3$ are each independently a substituted or unsubstituted aromatic ring group or aromatic heterocyclic group; $X^1$ to $X^{18}$ are each a hydrogen atom, halogen atom, alkyl group, alkoxy group, alkylthio group, alkenyl group, alkenyloxy group, alkenylthio group, aromatic-ring-containing alkyl group, aromatic-ring-containing alkyloxy group, aromatic-ring-containing alkylthio group, aromatic ring group, aromatic heterocyclic group, aromatic ring oxy group, aromatic ring thio group, aromatic ring alkenyl group, alkenyl aromatic ring group, amino group, carbazolyl group, cyano group, hydroxyl group, —$COOR^{1'}$ ($R^{1'}$ is a hydrogen atom, alkyl group, alkenyl group, aromatic-ring-containing alkyl group, or aromatic ring group), —$COR^{2'}$ ($R^{2'}$ is a hydrogen atom, alkyl group, alkenyl group, aromatic-ring-containing alkyl group, aromatic ring group or amino group) or —$OCOR^{3'}$ ($R^{3'}$ is an alkyl group, alkenyl group, aromatic-ring-containing alkyl group or aromatic ring group); and adjacent groups of $X^1$ to $X^{18}$ may be bonded to each other to form a ring with a substituted carbon atom.

A fluorescent compound containing a fluoranthene skeleton preferably contains an electron-donating group for high performance and long lifetime. A preferable electron-donating group is a substituted or unsubstituted arylamino group. A fluorescent compound containing a fluoranthene skeleton preferably has 5 or more fused rings, more preferably 6 or more fused rings, for the following reason. The fluorescent compound has a fluorescent peak wavelength of 540 to 700 nm. The emission from a blue emitting material and emission from the fluorescent compound overlap to give a white color.

The above-mentioned fluorescent compound preferably contains a plurality of fluoranthene skeletons since the emitted light color falls in the yellow-to-orange or red zone. A particularly preferred fluorescent compound contains an electron-donating group, and a fluoranthene or perylene skeleton, and has a fluorescent peak wavelength of 540 to 700 nm.

The thickness of first emitting layer is preferably 1 to 60 nm, more preferably 5 to 30 nm and most preferably 5 to 20 nm. When it is less than 1 nm, the luminous efficiency may decrease. When it exceeds 60 nm, the driving voltage may increase.

3. Second Emitting Layer Formed of Electron Transporting Material

The electron mobility of the second emitting layer is larger than the hole mobility thereof in the electric field range of $10^2$ to $10^8$ V/cm from the above mobility relationship.

In regard to the emission color, it is preferable that the second emitting layer be a blue emitting layer from the view point of the energy gap relationship. The maximum wavelength of the blue light is preferably 450 to 500 nm.

As examples of the emitting material, host material, and dopant which may be used for the second emitting layer, an arylamine compound and/or styryl amine compound, anthracene, naphthalene, phenanthrene, pyrene, tetracene, coronene, chrysene, fluoresceine, perylene, phthaloperylene, naphthaloperylene, perynone, phthaloperynone, naphthaloperynone, diphenylbutadiene, tetraphenylbutadiene, coumarin, oxadizole, aldazine, bisbenzoxazoline, bisstyryl, pyrazine, cyclopentadiene, quinoline metal complex, aminoquinoline metal complex, benzoquinoline metal complex, imine, diphenylethylene, vinylanthracene, diaminocarbazole, pyrane, thiopyran, polymethine, merocyanine, imidazole chelated oxynoid compound, quinacridon, rubrene, fluorescent dye, and the like can be given. Note that the material for the second emitting layer is not limited thereto.

The second emitting layer preferably comprises a host material and a dopant. The host material preferably has an electron mobility of $10^{-6}$ cm$^2$/V·second or more when applied with an electric field of $10^4$ to $10^6$ V/cm.

As the host material, the compounds represented by the following formulas (i) to (ix) are preferred.

Asymmetrical Anthrathene Represented by the Following Formula (i)

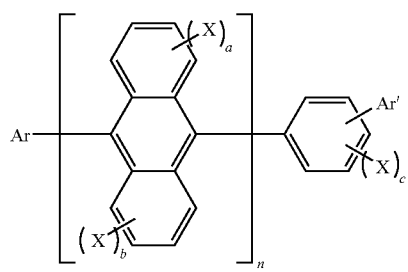

(i)

wherein Ar is a substituted or unsubstituted condensed aromatic group having 10 to 50 nucleus carbon atoms, Ar' is a substituted or unsubstituted aromatic group having 6 to 50 nucleus carbon atoms, X is a substituted or unsubstituted aromatic group having 6 to 50 nucleus carbon atoms, substituted or unsubstituted aromatic heterocyclic group having 5 to 50 nucleus carbon atoms, a substituted or unsubstituted alkyl group having 1 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus carbon atoms, a substituted or unsubstituted arythio group having 5 to 50 nucleus carbon atoms, a substituted or unsubstituted alkoxycarbonyl group having 1 to 50 carbon atoms, a carboxyl group, a halogen atom, a cyano group, a nitro group or a hydroxyl group.

a, b and c are each an integer of 0 to 4.

n is an integer of 1 to 3. When n is two or more, the groups in [ ] may be the same or different.

Asymmetrical Monoanthrathene Derivatives Represented by the Following Formula (ii)

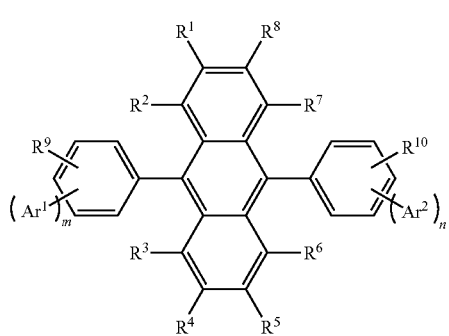

(ii)

wherein Ar$^1$ and Ar$^2$ are independently a substituted or unsubstituted aromatic ring group having 6 to 50 nucleus carbon atoms, and m and n are each an integer of 1 to 4, provided that in the case where m=n=1 and Ar$^1$ and Ar$^2$ are symmetrically bonded to the benzene rings, Ar$^1$ and Ar$^2$ are not the same, and in the case where m or n is an integer of 2 to 4, m is different from n, R$^1$ to R$^{10}$ are independently a hydrogen atom, a substituted or unsubstituted aromatic ring group having 6 to 50 nucleus carbon atoms, a substituted or unsubstituted aromatic hetrocyclic group having 5 to 50 nucleus carbon atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus carbon atoms, a substituted or unsubstituted arylthio group having 5 to 50 nucleus carbon atoms, a substituted or unsubstituted alkoxycarbonyl group having 1 to 50 carbon atoms, a substituted or unsubstituted silyl group, a carboxyl group, a halogen atom, a cyano group, a nitro group or a hydroxyl group.

Asymmetrical Pyrene Derivatives Represented by the Following Formula (iii)

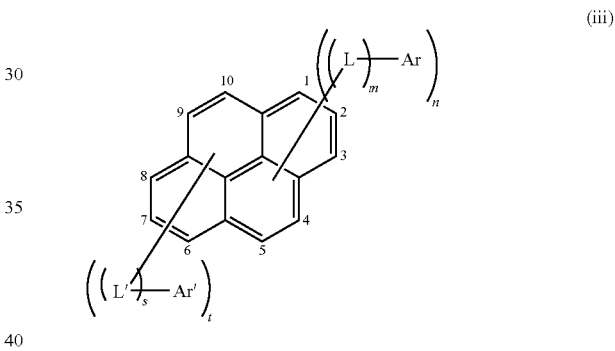

(iii)

wherein Ar and Ar' are each a substituted or unsubstituted aromatic group having 6 to 50 nucleus carbon atoms;

L and L' are each a substituted or unsubstituted phenylene group, a substituted or unsubstituted naphthalenylene group, a substituted or unsubstituted fluolenylene group, or a substituted or unsubstituted dibenzosilolylene group;

m is an integer of 0 to 2, n is an integer of 1 to 4, s is an integer of 0 to 2, and t is an integer of 0 to 4;

L or Ar bonds at any one position of 1 to 5 of the pyrene, and L' or Ar' bonds at any one position of 6 to 10 of the pyrene;

provided that when n+t is an even number, Ar, Ar', L and L' satisfy the following (1) and (2):

(1) Ar≠Ar' and/or L≠L' where ≠ means these substituents are groups having different structures from each other.

(2) when Ar=Ar' and L=L', (2-1) m≠s and/or n≠t, or (2-2) when m=s and n=t, (2-2-1) L and L', or the pyrene each bond to Ar and Ar' at different positions, or (2-2-2) when L and L', or the pyrene each bond to Ar and Ar' at the same positions, the pyrene is neither substituted by L and L', or Ar and Ar' at 1 and 6 positions, nor 2 and 7 positions.

Asymmetrical Anthrathene Represented by the Following Formula (iv)

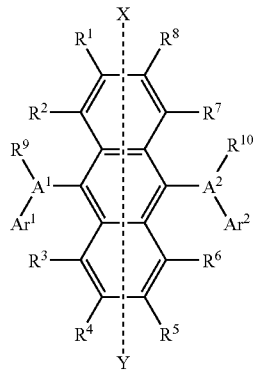

(iv)

wherein $A^1$ and $A^2$ are independently a substituted or unsubstituted condensed aromatic ring group having 10 to 20 nucleus carbon atoms, $Ar^1$ and $Ar^2$ are independently a hydrogen atom or a substituted or unsubstituted aromatic ring group with 6 to 50 nucleus carbon atoms, $R^1$ to $R^{10}$ are independently a hydrogen atom or a substituted or unsubstituted aromatic ring group having 6 to 50 nucleus carbon atoms, a substituted or unsubstituted aromatic hetrocyclic group having 5 to 50 nucleus carbon atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 nucleus carbon atoms, a substituted or unsubstituted arylthio group having 5 to 50 nucleus carbon atoms, a substituted or unsubstituted alkoxycarbonyl group having 1 to 50 carbon atoms, a substituted or unsubstituted silyl group, a carboxyl group, a halogen atom, a cyano group, a nitro group or a hydroxyl group, and each of $Ar^1$, $Ar^2$, $R^9$ and $R^{10}$ may be plural, and adjacent groups thereof may form a saturated or unsaturated ring structure, provided that groups do not symmetrically bond to 9 and 10 positions of the central anthracene with respect to X—Y axis.

Anthrathene Derivative Represented by the Following Formula (v)

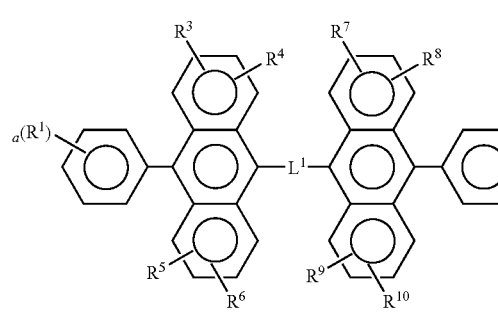

(v)

wherein $R^1$ to $R^{10}$ are independently a hydrogen atom, an alkyl group, a cycloalkyl group, an aryl group which may be substituted, an alkoxy group, an aryloxy group, an alkylamino group, an alkenyl group, an arylamino group or a heterocyclic group which may be substituted; a and b are each an integer of 1 to 5; when they are 2 or more, $R^1$s or $R^2$s may be the same or different, or $R^1$s or $R^2$s may be bonded together to form a ring; $R^3$ and $R^4$, $R^5$ and $R^6$, $R^7$ and $R^8$, or $R^9$ and $R^{10}$ may be bonded together to form a ring; and $L^1$ is a single bond, —O—, —S—, —N(R)— (R is an alkyl group or a substituted or unsubstituted aryl group), an alkylene group or an arylene group.

Anthrathene Derivative Represented by the Following Formula (vi)

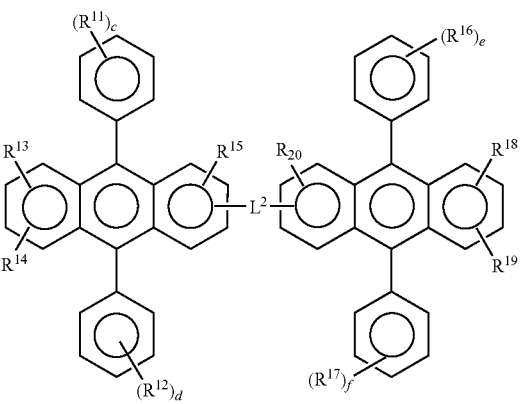

(vi)

wherein $R^{11}$ to $R^{20}$ are independently a hydrogen atom, an alkyl group, a cycloalkyl group, an aryl group, an alkoxy group, an aryloxy group, an alkylamino group, an arylamino group or a heterocyclic group which may be substituted; c, d, e and f are each an integer of 1 to 5; when they are 2 or more, $R^{11}$s, $R^{12}$s, $R^{16}$s or $R^{17}$s may be the same or different, $R^{11}$s, $R^{12}$s, $R^{16}$s or $R^{17}$s may be bonded together to form a ring, or $R^{13}$ and $R^{14}$, or $R^{18}$ and $R^{19}$ may be bonded together to form a ring; and $L^2$ is a single bond, —O—, —S—, —N(R)— (R is an alkyl group or a substituted or unsubstituted aryl group), an alkylene group or an arylene group.

Spirofluorene Derivatives Represented by the Following Formula (vii)

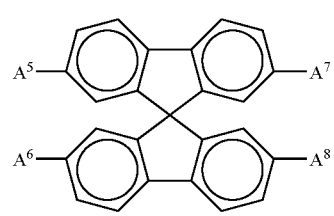

(vii)

wherein $A^5$ to $A^8$ are each independently a substituted or unsubstituted biphenyl group or a substituted or unsubstituted naphthyl group.

Condensed Ring-Containing Compounds Represented by the Following Formula (viii)

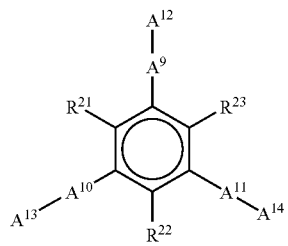

(viii)

wherein $A^9$ to $A^{14}$ are individually a hydrogen atom or a substituted or unsubstituted aryl group having 6 to 50 nucleus carbon atoms, and $R^{21}$ to $R^{23}$ are individually a hydrogen atom, alkyl group having 1 to 6 carbon atoms, cycloalkyl group having 3 to 6 carbon atoms, alkoxy group having 1 to 6 carbon atoms, aryloxy group having 5 to 18 carbon atoms, aralkyloxy group having 7 to 18 carbon atoms, arylamino group having 5 to 16 carbon atoms, nitro group, cyano group, ester group having 1 to 6 carbon atoms, or a halogen atom, provided that at least one of $A^9$ to $A^{14}$ is a group having a condensed aromatic ring with three or more rings.

Fluorene Compounds Represented by the Following Formula (ix)

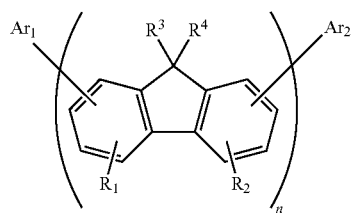

(ix)

wherein $R_1$ and $R_2$ are a hydrogen atom, a substituted or unsubstituted alkyl group, substituted or unsubstituted aralkyl group, substituted or unsubstituted aryl group, substituted or unsubstituted heterocyclic group, substituted amino group, cyano group, or a halogen atom. $R_1$s or $R_2$s bonded to different fluorene groups may be the same or different, and $R_1$ and $R_2$ bonded to a single fluorene group may be the same or different. $R_3$ and $R_4$ are a hydrogen atom, a substituted or unsubstituted alkyl group, substituted or unsubstituted aralkyl group, substituted or unsubstituted aryl group, or substituted or unsubstituted heterocyclic group, provided that $R_3$s or $R_4$s bonded to different fluorene groups may be the same or different, and $R_3$ and $R_4$ bonded to a single fluorene group may be the same or different. $Ar_1$ and $Ar_2$ are a substituted or unsubstituted condensed polycyclic aromatic group with a total number of benzene rings of three or more or a condensed polycyclic heterocyclic group which is bonded to the fluorene group through substituted or unsubstituted carbon and has a total number of benzene rings and heterocyclic rings of three or more, provided that $Ar_1$ and $Ar_2$ may be the same or different. n is an integer of 1 to 10.

Among the above compounds, the host material is preferably the anthracene derivative, more preferably the monoanthracene derivative, and particularly the asymmetrical anthracene.

The blue dopant is preferably an arylamine compound and/or a styrylamine compound.

As examples of the arylamine compound, a compound of the following formula (A) can be given. As examples of the styrylamine compound, a compound of the following formula (B) can be given.

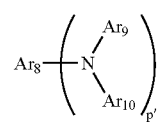

(A)

wherein $Ar_8$ is a group selected from phenyl, biphenyl, terphenyl, stilbene, and distyrylaryl, and $Ar_9$ and $Ar_{10}$ are individually a hydrogen atom or an aromatic group having 6 to 20 carbon atoms, provided that $Ar_9$ and $Ar_{10}$ may be replaced. p' is an integer of 1 to 4. More preferably, $Ar_9$ and/or $Ar_{10}$ is replaced with a styryl group.

As the aromatic group having 6 to 20 carbon atoms, a phenyl group, naphthyl group, anthracenyl group, phenanthryl group, terphenyl group, and the like are preferable.

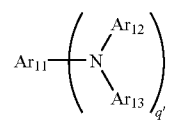

(B)

wherein $Ar_{11}$ to $Ar_{13}$ are aryl groups having 5 to 40 nucleus carbon atoms which may be substituted. q' is an integer of 1 to 4.

As the aryl groups having 5 to 40 nucleus carbon atoms, phenyl, naphthyl, anthracenyl, phenanthryl, pyrenyl, coronyl, biphenyl, terphenyl, pyrrolyl, furanyl, thiophenyl, benzothiophenyl, oxadiazolyl, diphenylanthracenyl, indolyl, carbazolyl, pyridyl, benzoquinolyl, fluoranthenyl, acenaphthofluoranthenyl, stilbene, and the like are preferable. The aromatic group having 5 to 40 nucleus carbon atoms may replaced with a substituent. Given as preferred substituents are alkyl groups having 1 to 6 carbon atoms (e.g. ethyl group, methyl group, i-propyl group, n-propyl group, s-butyl group, t-butyl group, pentyl group, hexyl group, cyclopentyl group, and cyclohexyl group), alkoxy groups having 1 to 6 carbon atoms (e.g. ethoxy group, methoxy group, i-propoxy group, n-propoxy group, s-butoxy group, t-butoxy-group, pentoxy group, hexyloxy group, cyclopentoxy group, and cyclohexyloxy group), aryl groups having 5 to 40 nucleus atoms, amino groups replaced with an aryl group having 5 to 40 nucleus atoms, ester groups containing an aryl group having 5 to 40 nucleus atoms, ester groups containing an alkyl group having 1 to 6 carbon atoms, cyano group, nitro group, and halogen atoms (e.g. chlorine, bromine, and iodine).

The thickness of the second emitting layer is preferably 1 to 60 nm, more preferably 5 to 40 nm, and most preferably 10 to 40 nm. If the thickness of the second emitting layer is less than 1 nm, it is difficult to form an emitting layer, whereby it may be difficult to adjust chromaticity. If the thickness of the second emitting layer exceeds 60 nm, the drive voltage may be increased.

The green dopant is preferably the arylamine compound and/or the styrylamine compound given as the blue dopant. The maximum wavelength of the green light is preferably 500 to 550 nm.

The green dopant is preferably an aromatic amine compound of the following formula (C).

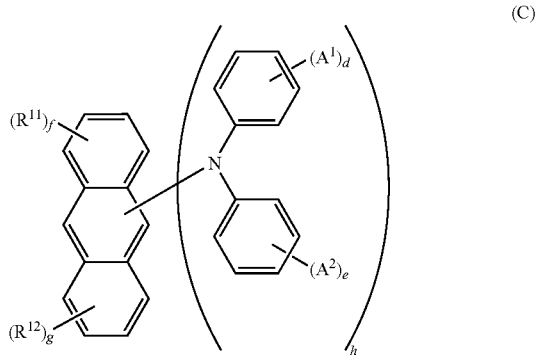

wherein $A^1$ to $A^2$ are independently a hydrogen atom, a substituted or unsubstituted alkyl group having 1 to 10 carbon atoms (preferably 1 to 6 carbon atoms), a substituted or unsubstituted aryl group having 5 to 50 nucleus carbon atoms (preferably 5 to 10 nucleus carbon atoms), a substituted or unsubstituted cycloalkyl group having 3 to 20 nucleus carbon atoms (preferably 5 to 10 nucleus carbon atoms), a substituted or unsubstituted alkoxy group having 1 to 10 carbon atoms (preferably 1 to 6 carbon atoms), a substituted or unsubstituted aryloxy group having 5 to 50 nucleus carbon atoms (preferably 5 to 10 nucleus carbon atoms), a substituted or unsubstituted arylamino group having 5 to 50 nucleus carbon atoms (preferably 5 to 20 nucleus carbon atoms), a substituted or unsubstituted alkylamino group having 1 to 10 carbon atoms (preferably 1 to 6 carbon atoms), or a halogen atom.

The substituted or unsubstituted alkyl group of $A^1$ to $A^2$ includes methyl, ethyl, propyl, isopropyl, butyl, sec-butyl, tert-butyl, pentyl, hexyl, heptyl, octyl, stearyl, 2-phenylisopropyl, trichloromethyl, trifluoromethyl, benzyl, α-phenoxybenzyl, α,α-dimethylbenzyl, α,α-methylphenylbenzyl, α,α-ditrifluoromethylbenzyl, triphenylmethyl, and α-benzyloxybenzyl groups.

The substituted or unsubstituted aryl group of $A^1$ to $A^2$ includes phenyl, 2-methylphenyl, 3-methylphenyl, 4-methylphenyl, 4-ethylphenyl, biphenyl, 4-methylbiphenyl, 4-ethylbiphenyl, 4-cyclohexylbiphenyl, terphenyl, 3,5-dichlorophenyl, naphtyl, 5-methylnaphtyl, anthryl, and pyrenyl groups.

The substituted or unsubstituted cycloalkyl group of $A^1$ to $A^2$ includes cyclopropyl, cyclobutyl, cyclopentyl, cyclohexyl, norbornyl, and adamantyl groups.

The substituted or unsubstituted alkoxy group of $A^1$ to $A^2$ includes methoxy, ethoxy, propoxy, isopropoxy, butoxy, isobutoxy, sec-butoxy, tert-butoxy, various pentyloxy, and various hexyloxy groups.

The substituted or unsubstituted aryloxy group of $A^1$ to $A^2$ includes phenoxy, tolyloxy, and naphthyloxy groups.

The substituted or unsubstituted arylamino group of $A^1$ to $A^2$ includes diphenylamino, ditolylamino, dinaphthylamino, and naphthylphenylamino groups.

The substituted or unsubstituted alkylamino group of $A^1$ to $A^2$ includes dimethylamino, diethylamino, and dihexylamino groups.

The halogen atom of $A^1$ to $A^2$ includes fluoride, chlorine, and bromine atoms.

In formula (C), $A^1$ and $A^2$ cannot be hydrogen atoms at the same time.

In formula (C), d and e are each an integer of 1 to 5, preferably 1 to 3. When d and e are each 2 or more, $A^1$s and $A^2$s may be the same or different. They may be joined together to form a saturated or unsaturated ring. h is an integer of 1 to 9, preferably 1 to 3.

$R^{11}$ is a substituted or unsubstituted secondary or tertiary alkyl group having 3 to 10 carbon atoms or a substituted or unsubstituted secondary or tertiary cycloalkyl group having 3 to 10 carbon atoms.

The substituted or unsubstituted secondary or tertiary alkyl group having 3 to 10 carbon atoms of $R^{11}$ includes isopropyl, tert-butyl, sec-butyl, tert-pentyl, 1-methylbutyl, 1-methylpentyl, 1,1'-dimethylpentyl, 1,1'-diethylpropyl, 1-benzyl-2-phenylethyl, 1-methoxyethyl, and 1-phenyl-1-methylethyl groups.

The substituted or unsubstituted secondary or tertiary cycloalkyl group having 3 to 10 carbon atoms of $R^{11}$ includes cyclopentyl, cyclohexyl, norbornyl, and adamantyl groups.

In formula (C), f is an integer of 1 to 9, preferably 1 to 3. When f is 2 or more, $R^{11}$s may be the same or different.

$R^{12}$ is a hydrogen atom, a substituted or unsubstituted alkyl group having 1 to 10 carbon atoms (preferably 1 to 6 carbon atoms), a substituted or unsubstituted aryl group having 5 to 50 nucleus carbon atoms (preferably 5 to 10 nucleus carbon atoms), a substituted or unsubstituted cycloalkyl group having 3 to 20 nucleus carbon atoms (preferably 5 to 10 nucleus-carbon atoms), a substituted or unsubstituted alkoxy group having 1 to 10 carbon atoms (preferably 1 to 6 carbon atoms), a substituted or unsubstituted aryloxy group having 5 to 50 nucleus carbon atoms (preferably 5 to 10 nucleus carbon atoms), a substituted or unsubstituted arylamino group having 5 to 50 nucleus carbon atoms (preferably 5 to 20 nucleus carbon atoms), a substituted or unsubstituted alkylamino group having 1 to 10 carbon atoms (preferably 1 to 6 carbon atoms), or a halogen atom.

Examples of the substituted or unsubstituted alkyl, aryl, cycloalkyl, alkoxy, aryloxy, arylamino, and alkylamino groups and halogen atom of $R^{12}$ include the same groups and atoms as those of $A^1$ to $A^2$ mentioned above.

In formula (C), g is an integer of 0 to 8 and preferably 0 to 2.

When g is 2 or more, $R^{12}$s may be the same or different.

In formula (C), f+g+h is an integer of 2 to 10 and preferably 2 to 6.

4. Third Emitting Layer Formed of Electron Transporting Material

The electron mobility of the third emitting layer is preferably larger than the hole mobility thereof in the electric field range of $10^2$ to $10^8$ V/cm in view of the above-mentioned mobility relationship.

For color of emitted light, the third emitting layer is preferably green emitting layer in view of the energy gap relationship. The green emission preferably has a maximum wavelength of 500 to 550 nm.

The third emitting layer preferably comprises a host material and a dopant. The same specific materials as those for the second emitting layer can be used. The host material is preferably the same as that of the second emitting layer, and preferably has an electron mobility of $10^{-6}$ cm$^2$/V·second or more when applied with an electric field of $10^4$ to $10^6$ V/cm.

The thickness of the third emitting layer is preferably 1 to 60 nm, more preferably 2 to 40 nm and most preferably 5 to 30 nm. When it is less than 1 nm, the formation of an emitting layer and the adjustment of chromaticity may become difficult. When it exceeds 60 nm, the driving voltage may increase.

5. Other Organic Layers (1) First Organic Layer

A hole-injecting layer, a hole-transporting layer, an organic semiconductor layer or the like can be arranged between the anode and the first emitting layer as a first organic layer. The hole-injecting layer or the hole transporting layer is a layer for helping the injection of holes into the emitting layer so as to transport holes to an emitting region. The hole mobility thereof is large and the ionization energy thereof is usually as small as 5.5 eV or less. A hole-injecting layer is formed to control energy level, for example, to reduce precipitous energy level changes. Such a hole-injecting or hole-transporting layer is preferably made of a material which can transport holes to the emitting layer at a low electric field intensity. The hole mobility thereof is preferably at least $10^{-6}$ cm$^2$/V·second when an electric field of, e.g., $10^4$ to $10^6$ V/cm is applied. Any materials which have the above preferable properties can be used as the material for forming the hole-injecting layer or the hole-transporting layer without particular limitation. The material for forming the hole-injecting layer or the hole-transporting layer can be arbitrarily selected from materials which have been widely used as a material transporting carriers of holes in photoconductive materials and known materials used in a hole-injecting layer of organic EL devices.

Specific examples of materials for a hole-injecting layer and a hole-transporting layer, include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 55-85495, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers) disclosed in JP-A-1-211399.

The above-mentioned substances can be used as the material of the hole-injecting layer or the hole-transporting layer. The following can also be used: porphyrin compounds (disclosed in JP-A-63-2956965 and others), aromatic tertiary amine compounds and styrylamine compounds (see U.S. Pat. No. 4,127,412, JP-A-53-27033, 54-58445, 54-149634, 54-64299, 55-79450, 55-144250, 56-119132, 61-295558, 61-98353 and 63-295695, and others), and aromatic tertiary amine compounds. The following can also be given as examples: 4,4'-bis(N-(1-naphthyl)-N-phenylamino)biphenyl, which has in the molecule thereof two condensed aromatic rings, disclosed in U.S. Pat. No. 5,061,569, and 4,4',4''-tris(N-(3-methylphenyl)-N-phenylamino)triphenylamine, wherein three triphenylamine units are linked to each other in a star-burst form, disclosed in JP-A-4-308688. Inorganic compounds such as aromatic dimethylidene type compounds, mentioned above as the material for an emitting layer, and p-type Si and p-type SiC can also be used as the material of the hole-injecting layer or the hole-transporting layer.

As the hole transporting material, the aromatic amine derivative of the following formula (1) is preferable.

(1)

wherein $L_1$ represents a divalent group selected from a substituted or unsubstituted arylene group having 5 to 60 carbon atoms or a heterocyclic group, and $Ar_7$ to $Ar_{10}$ individually represent a substituted or unsubstituted substituent having 5 to 50 nucleus atoms or a substituent of the following formula.

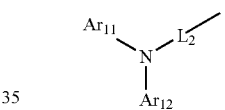

wherein $L_2$ represents a divalent group selected from a substituted or unsubstituted arylene group having 5 to 60 carbon atoms or a heterocyclic group, and $Ar_{11}$ and $Ar_{12}$ individually represent substituted or unsubstituted substituents having 5 to 50 nucleus atoms.

As examples of $L_1$ and $L_2$, biphenylene, terphenylene, phenanthrene, and fluorenylene can be given. Of these, biphenylene and terphenylene are preferable, with biphenylene being still more preferable.

As examples of $Ar_7$ to $Ar_{12}$, a biphenyl group, terphenyl group, phenanthrene group, fluorenyl group, 1-naphthyl group, 2-naphthyl group, and phenyl group can be given. Of these, a biphenyl group, terphenyl group, 1-naphthyl group, and phenyl group are preferable.

In the compound of the formula (1), it is preferable that $Ar_7$ to $Ar_{10}$ be identical substituents. In this case, $Ar_7$ to $Ar_{10}$ are preferably biphenyl groups or terphenyl groups, and still more preferably biphenyl groups.

In the compound of the formula (1), it is preferable that $Ar_8$ to $Ar_{10}$ among $Ar_7$ to $Ar_{10}$ be identical substituents. In this case, $Ar_8$ to $Ar_{10}$ are preferably biphenyl groups or terphenyl groups, and more preferably biphenyl groups, and $Ar_7$ is preferably a biphenyl group, terphenyl group, phenanthrene group, fluorenyl group, 1-naphthyl group, 2-naphthyl group, or phenyl group, and more preferably a biphenyl group, terphenyl group, 1-naphthyl group, or phenyl group. Still more preferably, $Ar_8$ to $Ar_{10}$ are biphenyl groups, and $Ar_7$ is a terphenyl group or a 1-naphthyl group.

In the compound of the formula (1), it is preferable that three or more of $Ar_7$ to $Ar_{10}$ be different substituents. $Ar_7$ to $Ar_{12}$ are preferably a biphenyl group, terphenyl group, phenanthrene group, fluorenyl group, 1-naphthyl group, 2-naphthyl group, or phenyl group, and more preferably a biphenyl group, terphenyl group, 1-naphthyl group, or phenyl group. Still more preferably, $Ar_9$ to $Ar_{10}$ are biphenyl groups, $Ar_7$ is a terphenyl group or a 1-naphthyl group, and $Ar_8$ is a phenyl group.

As the hole injecting layer, a compound of the following formula may be used.

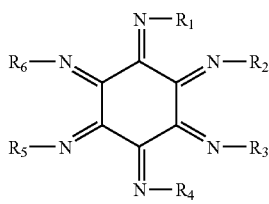

wherein $R_1$, $R_2$, $R_3$, $R_4$, $R_5$, and $R_6$ represent a substituted or unsubstituted aryl group, substituted or unsubstituted aryl group, substituted or unsubstituted aralkyl group, or substituted or unsubstituted heterocyclic group. $R_1$, $R_2$, $R_3$, $R_4$, $R_5$, and $R_6$ may be the same or different. $R_1$ and $R_2$, $R_3$ and $R_4$, and $R_5$ and $R_6$, or $R_1$ and $R_6$, $R_2$ and $R_3$, and $R_4$ and $R_5$ may form condensed rings.

The following compound is more preferable.

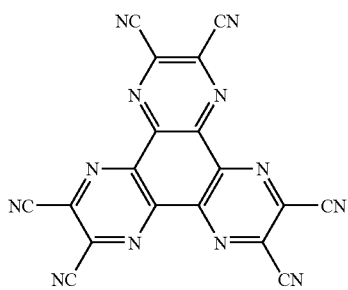

This hole-injecting layer or the hole-transporting layer may be a single layer made of one or more of the above-mentioned materials, or may be stacked hole-injecting layers or hole-transporting layers made of different compounds. The thickness of the hole-injecting layer or the hole-transporting layer is not particularly limited, and is preferably 20 to 200 nm.

The organic semiconductor layer is a layer for helping the injection of holes or electrons into the emitting layer, and is preferably a layer having an electric conductivity of $10^{-10}$ S/cm or more. As the material of such an organic semiconductor layer, electroconductive oligomers such as thiophene-containing oligomers or arylamine-containing oligomers disclosed in JP-A-8-193191, and electroconductive dendrimers such as arylamine-containing dendrimers may be used. The thickness of the organic semiconductor layer is not particularly limited, and is preferably 10 to 1,000 nm.

(2) Second Organic Layer

An electron-injecting layer, an electron-transporting layer and the like can be arranged between the cathode and the second emitting layer as a second organic layer. The electron-injecting layer or the electron-transporting layer is a layer for helping the injection of electrons into the emitting layer, and has a large electron mobility. The electron-injecting layer is formed to control energy level, for example, to reduce precipitous energy level changes. The material used for the electron-injecting layer or electron-transporting layer is preferably a metal complexes of 8-hydroxyquinoline or derivatives thereof, oxadiazole derivatives and nitrogen-containing heterocyclic derivatives. Specific examples of the metal complexes of 8-hydroxyquinoline or derivatives thereof include metal chelate oxynoid compounds containing a chelate of oxine (generally, 8-quinolinol or 8-hydroxyquinoline). For example, tris(8-quinolinol)aluminum can be used. Examples of the oxadiazole derivatives include electron-transporting compounds represented by the following formulas:

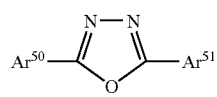

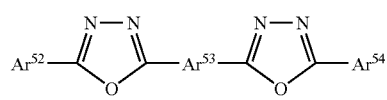

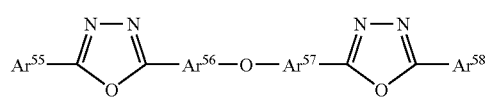

wherein $Ar^{50}$, $Ar^{51}$, $Ar^{52}$, $Ar^{54}$, $Ar^{55}$ and $Ar^{58}$ may be the same or different and each represent a substituted or unsubstituted aryl group; and $Ar^{53}$, $Ar^{56}$ and $Ar^{57}$ each represent a substituted or unsubstituted arylene group and $Ar^{56}$ and $Ar^{57}$ may be the same or different. Examples of the aryl group in these formulas include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituents for these include alkyl groups with 1 to 10 carbon atoms, alkoxy groups with 1 to 10 carbon atoms, and a cyano group. The electron-transporting compounds are preferably ones from which a thin film can be easily formed. Specific examples of the electron-transporting compounds are mentioned below.

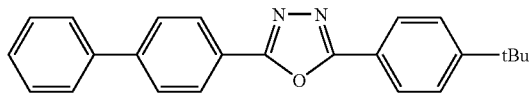

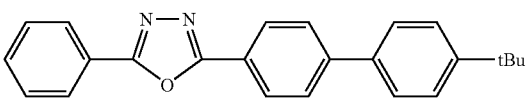

-continued

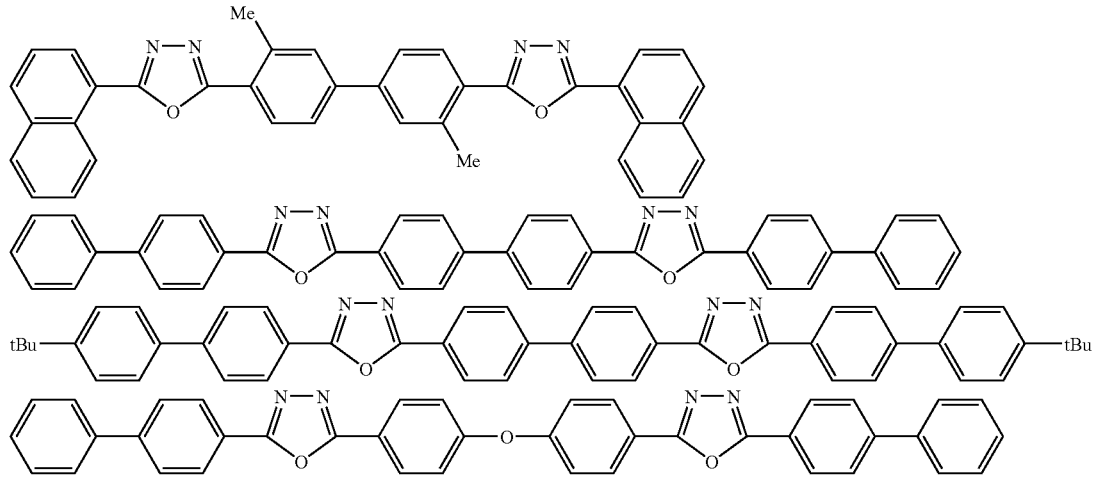

As the nitrogen-containing heterocyclic derivatives, nitrogen-containing compounds having structures illustrated by (a) to (c) and not being metal complexes can be given.

(a) 5-membered or 6-membered ring containing an =N-skeleton.

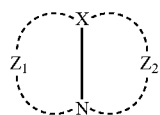
(b)

wherein X is a carbon atom or nitrogen atom, and $Z_1$ and $Z_2$ are each a group of atoms capable of forming a nitrogen-containing heterocycle.

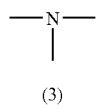
(c)

(3)

The nitrogen-containing heterocyclic derivative is preferably an organic compound containing a nitrogen-containing aromatic polycyclic group containing a five-membered ring or six-membered ring, and when the group contains a plurality of nitrogen atoms, the organic compound has a skeleton containing the nitrogen atoms in non-adjacent bonding positions. In the case where the nitrogen-containing aromatic polycyclic group has a plurality of nitrogen atoms, the nitrogen-containing aromatic polycyclic organic compounds having a skeleton with a combination of the above-mentioned (a) and (b), or (a) and (c) can be given.

As the nitrogen-containing heterocyclic derivative, the compounds represented by the following formulas (d) to (g) can be given.

(d) Nitrogen-Containing Heterocyclic Derivatives Containing a Nitrogen-Containing Heterocyclic Group Selected from the Following Formulas

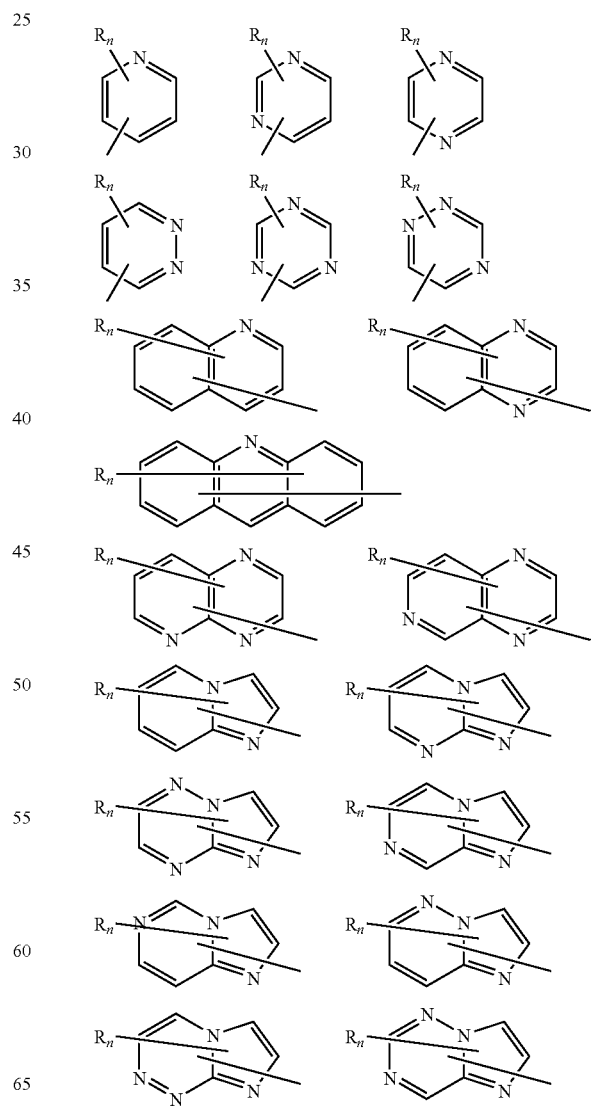

-continued

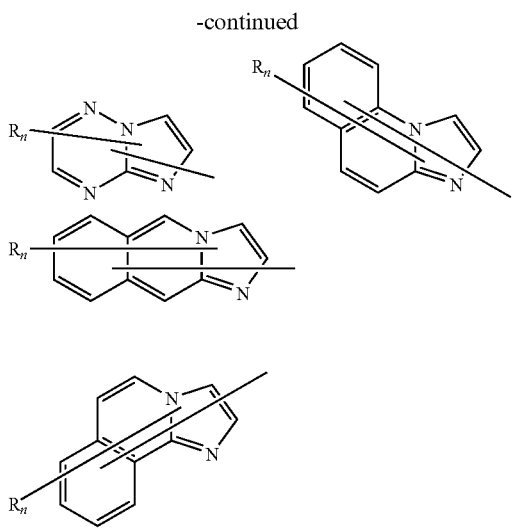

wherein R is an aryl group with 6 to 40 carbon atoms, heteroaryl group with 3 to 40 carbon atoms, alkyl group with 1 to 20 carbon atoms or alkoxy group with 1 to 20 carbon atoms; and n is an integer of 0 to 5. When n is an integer of 2 or more, a plurality of Rs may be the same as or different from each other.

(e) Nitrogen-Containing Heterocyclic Compounds Represented by the Following Formula as a Still Preferable Specific Compound:

$$\text{HAr-L-Ar}^{61}\text{—Ar}^{62}$$

wherein HAr is a substituted or unsubstituted nitrogen-containing heterocyclic ring with 3 to 40 carbon atoms;

L is a single bond, a substituted or unsubstituted arylene group with 6 to 40 carbon atoms, or a substituted or unsubstituted heteroarylene group with 3 to 40 carbon atoms;

$Ar^{61}$ is a substituted or unsubstituted bivalent aromatic hydrocarbon group with 6 to 40 carbon atoms;

$Ar^{62}$ is a substituted or unsubstituted aryl group with 6 to 40 carbon atoms or a substituted or unsubstituted heteroaryl group with 3 to 40 carbon atoms.

As the HAr, the following groups can be illustrated.

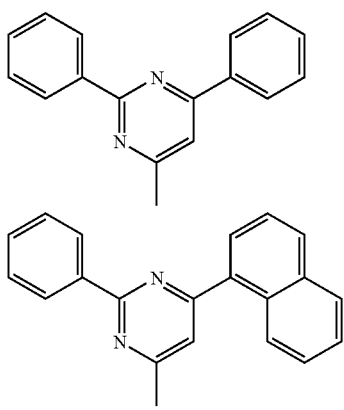

-continued

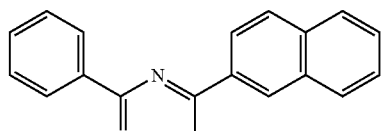

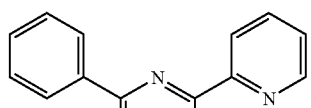

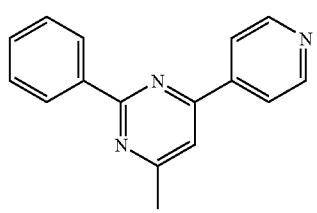

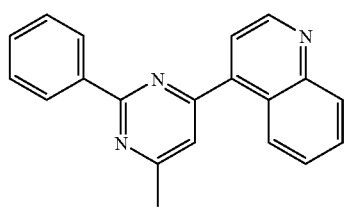

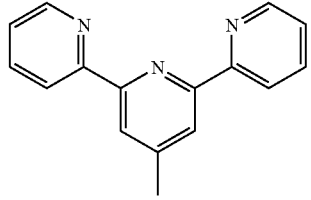

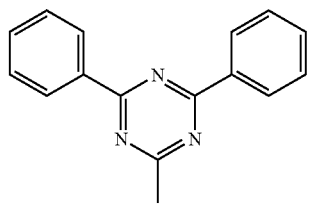

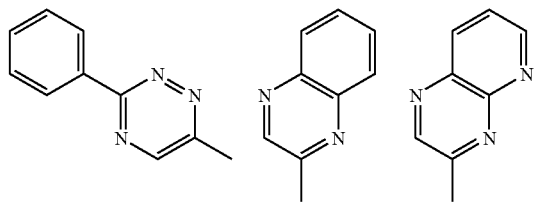

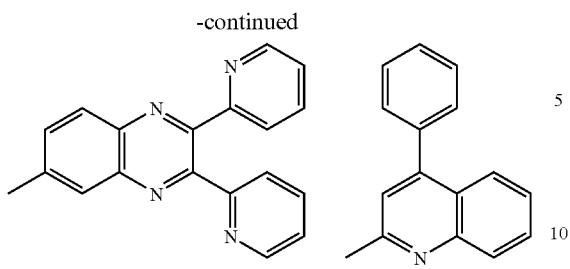
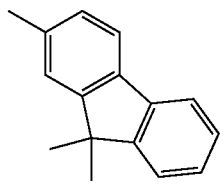

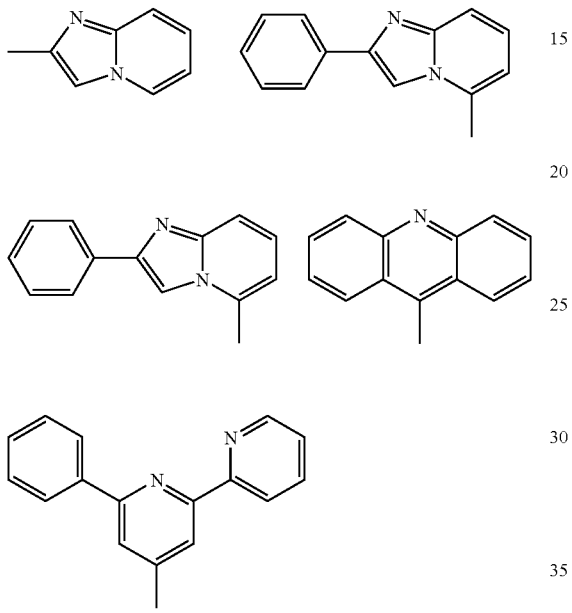

As the L, the following groups can be illustrated.

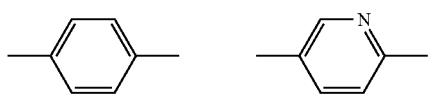

As the Ar⁶², the following groups can be illustrated.

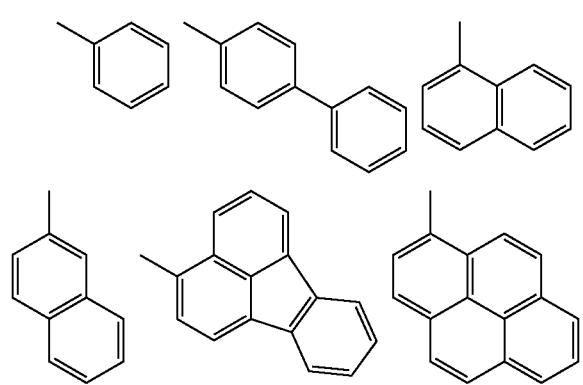

-continued

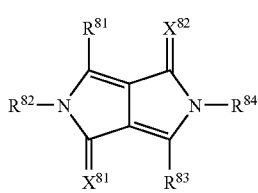

As the Ar⁶¹, the following groups can be illustrated.

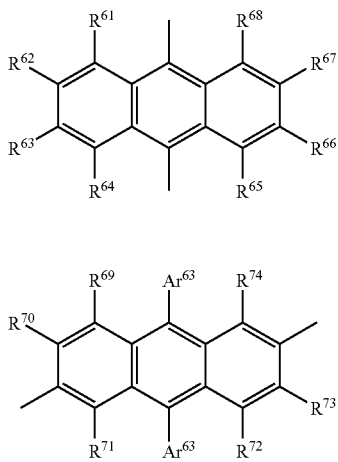

wherein $R^{61}$ to $R^{74}$ are each independently a hydrogen atom, halogen atom, alkyl group with 1 to 20 carbon atoms, alkoxy group with 1 to 20 carbon atoms, aryloxy group with 6 to 40 carbon atoms, aryl group with 6 to 40 carbon atoms which may have a substituent or heteroaryl group with 3 to 40 carbon atoms; and $Ar^{63}$s are each an aryl group with 6 to 40 carbon atoms which may have a substituent or heteroaryl group with 3 to 40 carbon atoms.

$R^{61}$ to $R^{74}$ are preferably a hydrogen atom.

(f) Compounds Disclosed in JP-A-9-3448 wherein $R^{81}$ to $R^{84}$ are individually a hydrogen atom, a substituted or unsubstituted aliphatic group, substituted or unsubstituted aliphatic ring group, substituted or unsubstituted carbocyclic aromatic ring group, or substituted or unsubstituted heterocyclic group, and $X^{81}$ and $X^{82}$ are individually an oxygen atom, a sulfur atom, or a dicyanomethylene group.

(g) Compounds Disclosed in JP-A-2000-173774

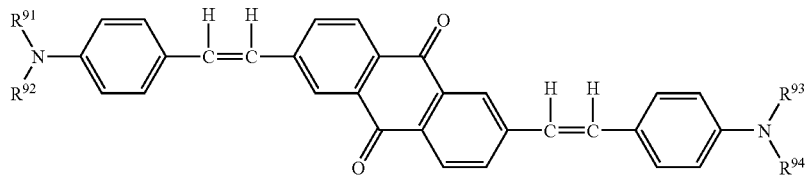

wherein $R^{91}$, $R^{92}$, $R^{93}$, and $R^{94}$, which may be the same or different, are aryl groups of the following formula.

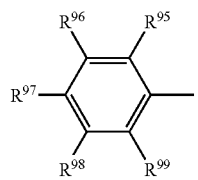

wherein $R^{95}$, $R^{96}$, $R^{97}$, $R^{98}$, and $R^{99}$, which may be the same or different, are a hydrogen atom or at least one of $R^{95}$, $R^{96}$, $R^{97}$, $R^{98}$, and $R^{99}$ is a saturated or unsaturated alkoxy group, alkyl group, amino group, or alkylamino group.

(h) Polymer Compounds Containing a Nitrogen-Containing Heterocyclic Group or Nitrogen-Containing Heterocyclic Derivative The thickness of the electron injecting layer or the electron transporting layer is preferably 1 to 100 nm, although the thickness is not limited thereto.

It is also preferable that the first emitting layer or the first organic layer which is the organic layer closest to the anode contain an oxidizing agent. A preferable oxidizing agent is an electron attracting agent or an electron acceptor. The electron attracting agent or electron acceptor is preferably an organic compound having an electron-attracting substituent or an electron-deficient ring.

As examples of the electron-attracting substituent, halogen, CN—, carbonyl group, aryl boron group, and the like can be given.

As examples of the electron-deficient ring, a compound selected from group consisting of 2-pyridyl, 3-pyridyl, 4-pyridyl, 2-quinolyl, 3-quinolyl, 4-quinolyl, 2-imidazole, 4-imidazole, 3-pyrazole, 4-pyrazole, pyridazine, pyrimidine, pyrazine, cinnoline, phthalazine, quinazoline, quinoxaline, 3-(1,2,4-N)-triazolyl, 5-(1,2,4-N)-triazolyl, 5-tetrazolyl, 4-(1-O,3-N)-oxazole, 5-(1-O,3-N)-oxazole, 4-(1-S,3-N)-thiazole, 5-(1-S,3-N)-thiazole, 2-benzoxazole, 2-benzothiazole, 4-(1,2,3-N)-benzotriazole, and benzimidazole, and the like can be given. Note that the electron-deficient ring is not limited thereto.

Preferred are Lewis acids, various quinone derivatives, dicyanoquinodimethane derivatives, or salts formed by an aromatic amine and Lewis acid.

It is still more preferable to use a quinoid derivative. As examples of the quinoid derivative, compounds of the following formulas (1a) to (1i) can be given. The compounds of the formulas (1a) and (1b) are more preferable.

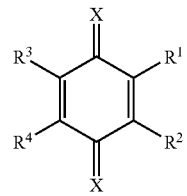 (1a)

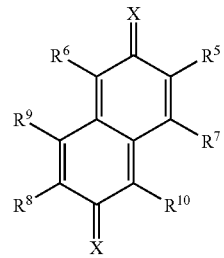 (1b)

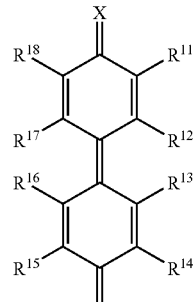 (1c)

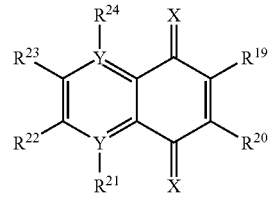 (1d)

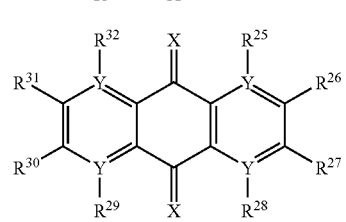 (1e)

-continued

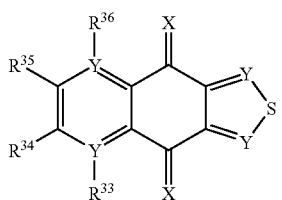
(1f)

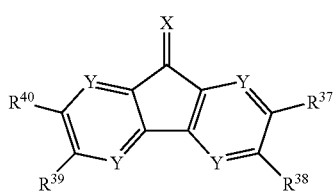
(1g)

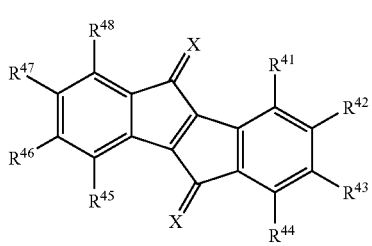
(1h)

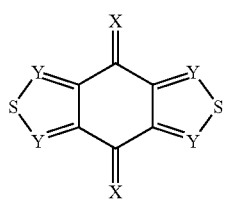
(1i)

In the formulas (1a) to (1i), $R^1$ to $R^{48}$ individually represent hydrogen, halogen, a fluoroalkyl group, cyano group, alkoxy group, alkyl group, or aryl group. Hydrogen and a cyano group are preferable.

In the formulas (1a) to (1i), X represents an electron-attracting group having one of the structures of the following formulas (j) to (p). The structures of the formulas (j), (k), and (l) are preferable.

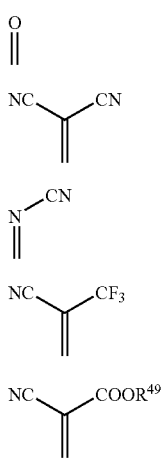

(j)

(k)

(l)

(m)

(n)

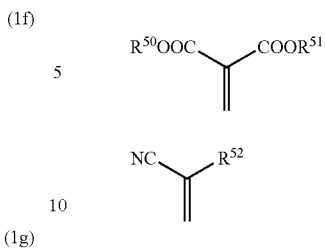
(o)

(p)

wherein $R^{49}$ to $R^{52}$ individually represent hydrogen, a fluoroalkyl group, alkyl group, aryl group, or heterocyclic ring, provided that $R^{50}$ and $R^{51}$ may form a ring.

In the formulas (1a) to (1i), Y represents —N= or —CH=.

As the halogen represented by $R^1$ to $R^{48}$, fluorine and chlorine are preferable.

As the fluoroalkyl group represented by $R^1$ to $R^{48}$, a trifluoromethyl group and a pentafluoroethyl group are preferable.

As the alkoxy group represented by $R^1$ to $R^{48}$, a methoxy group, ethoxy group, iso-propoxy group, and tert-butoxy group are preferable.

As the alkyl group represented by $R^1$ to $R^{48}$, a methyl group, ethyl group, propyl group, iso-propyl group, tert-butyl group, and cyclohexyl group are preferable.

As the aryl group represented by $R^1$ to $R^{48}$, a phenyl group and a naphthyl group are preferable.

The fluoroalkyl group, alkyl group, and aryl group represented by $R^{49}$ to $R^{52}$ are the same as those of $R^1$ to $R^{48}$.

As the heterocyclic ring represented by $R^{49}$ to $R^{52}$, substituents of the following formulas are preferable.

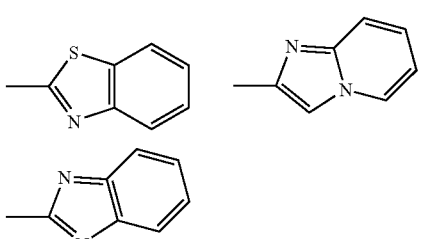

When $R^{50}$ and $R^{51}$ form a ring, X is preferably a substituent of the following formula.

wherein $R^{51'}$ and $R^{52'}$ individually represent a methyl group, ethyl group, propyl group, or tert-butyl group.

As specific examples of the quinoid derivative, the following compounds can be given.
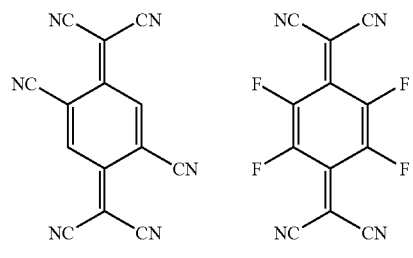
(CN)₂—TCNQ
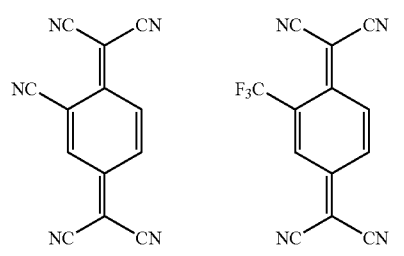
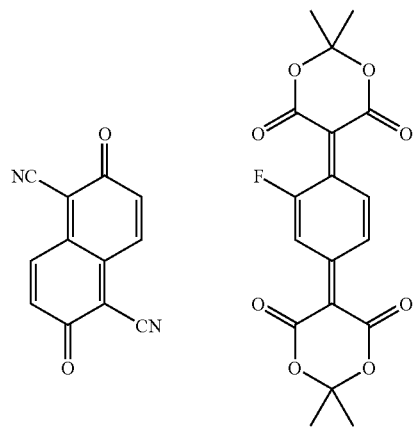
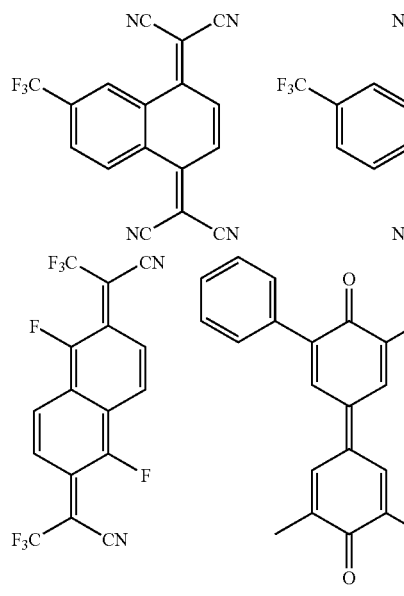
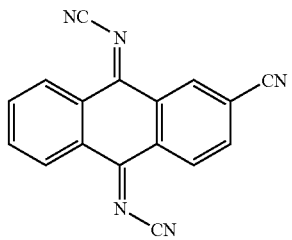
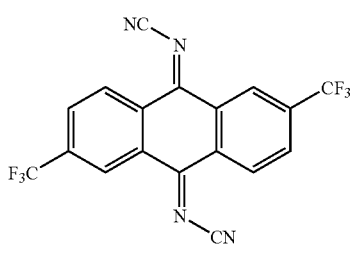
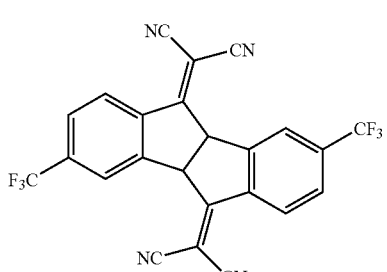
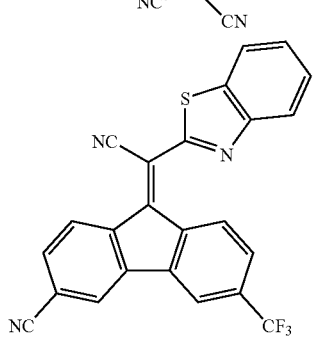

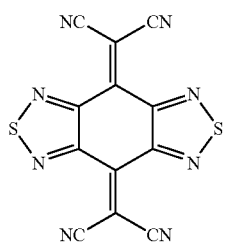

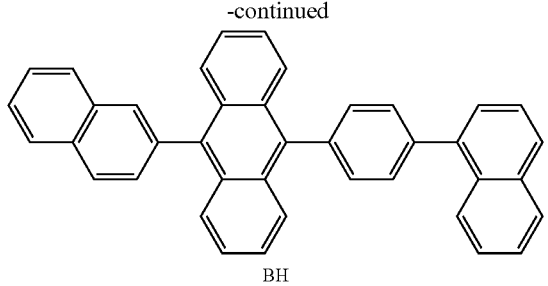

BH

An emitting layer or second organic layer that is the layer closest to a cathode preferably contains a reducing agent. Preferable reducing agents are alkali metals, alkaline earth metals, oxides of alkali metals, oxides of alkaline earth metals, oxides of rare earth metals, halides of alkali metals, halides of alkaline earth metals, halides of rare earth metals, and complexes formed of alkali metals and aromatic compounds. Particularly preferred alkali metals are Cs, Li, Na and K.

In the invention, the hole transporting layer (hole injecting layer) is preferably formed of the same material as the material used for the carrier barrier layer mentioned above. This is advantageous in the industrial production cost since the kinds of the materials used for the organic EL device can be reduced.

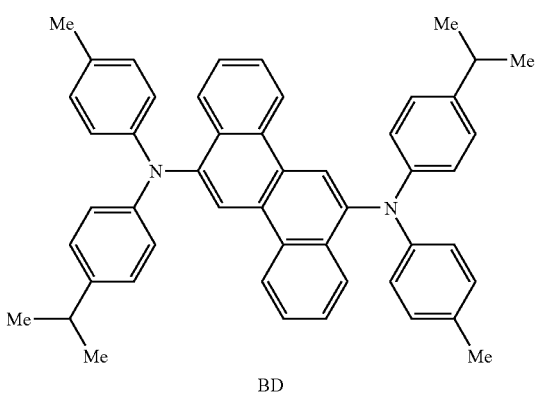

BD

EXAMPLES

The compounds used in the examples and the comparative examples are illustrated below.

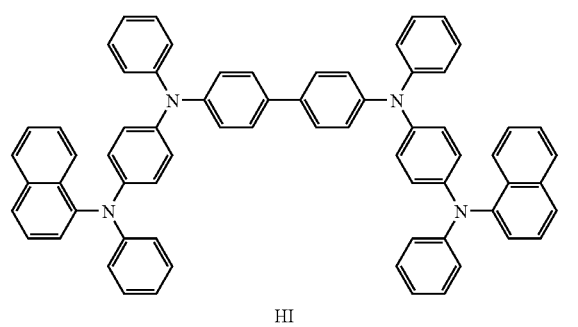

HI

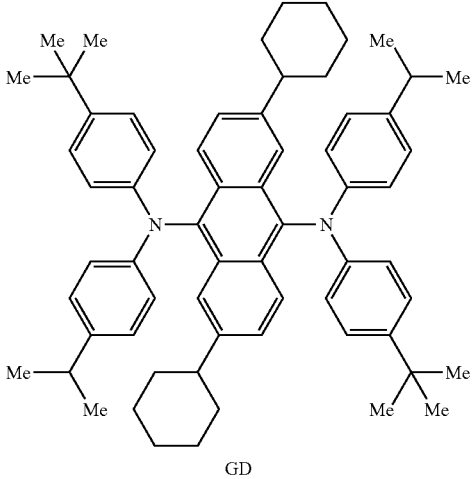

GD

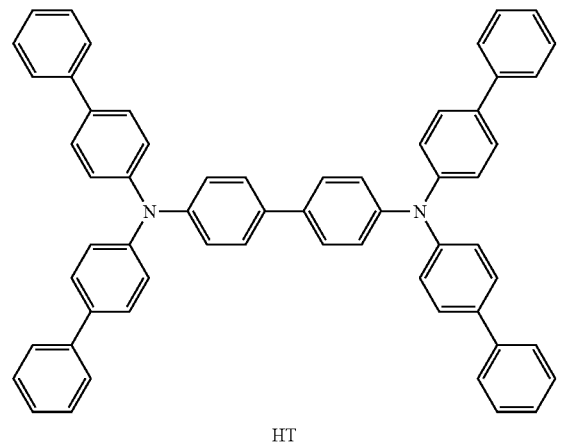

HT

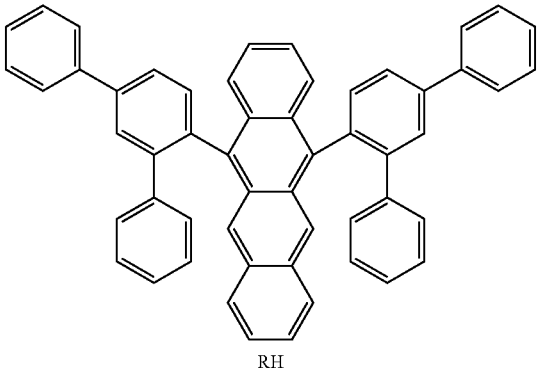

RH

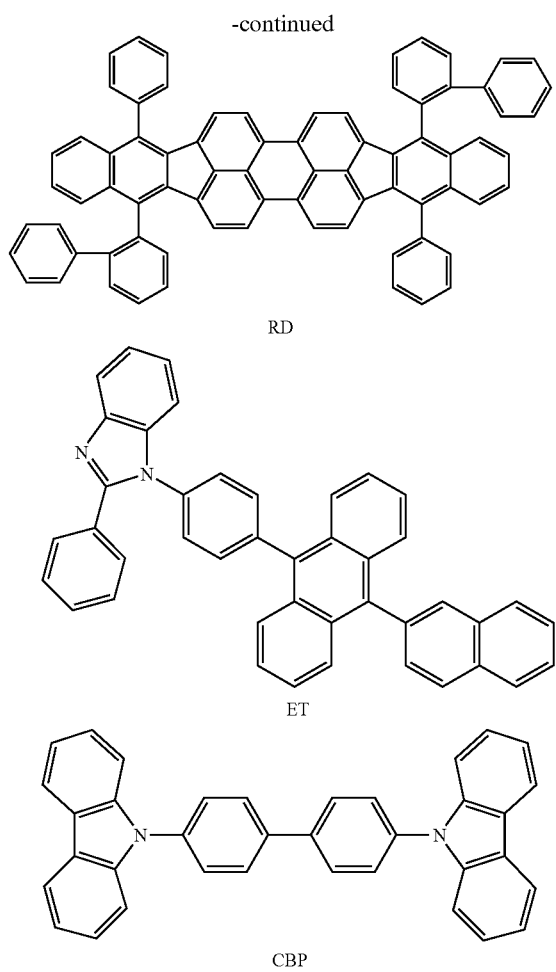

RD

ET

CBP

Methods for measuring properties of compounds are described below.

(1) Energy Gap (Eg)

A solution of a material (solvent: toluene) was measured for ultraviolet-visible light absorption spectra with an ultraviolet-visible light spectrophotometer (UV-3100PC, supplied by Shimadzu Corporation). An optical band gap was calculated from the long wavelength side tangent line thereof. The optical band gap was taken as Energy gap (Eg).

(2) Ionization Potential (IP)

Measured in atmosphere with a photoelectron spectrometer (AC-1, supplied by Riken Keiki Co., Ltd.). Photoelectrons released were plotted at ½ fractional power relative to the energy of ultraviolet ray with which a material (powder) was irradiated, and the threshold value of photoelectron release energy was taken as IP.

(3) Affinity Level (Af)

$Af=Ip-Eg.$ (4) Driving Voltage

A voltage (unit: V) which was applied between ITO and Al such that the current density was 10 mA/cm² was measured.

(5) Luminance Efficiency

Luminance efficiency (unit: cd/A) was calculated from an EL spectrum at the current density of 10 mA/cm² measured with a spectral radiance meter (CS-1000A, KONICA MINOLTA, INC.)

(6) CIE 1931 Chromaticity

CIE 1931 chromaticity (x, y) was calculated from an EL spectrum at the current density of 10 mA/cm² measured with a spectral radiance meter (CS-1000A, KONICA MINOLTA, INC.)

(7) External Quantum Efficiency

External quantum efficiency was calculated from an EL spectrum at the current density of 10 mA/cm² measured with a spectral radiance meter (CS-1000A, KONICA MINOLTA, INC.) on the basis of the following formula.

$$EQE\ (\%) = \frac{\int\left(\int(\text{Spectral radiant intensity/Energy of photon})d\lambda\right)d\Omega}{\text{Current density/Elementary charge of electron}}$$

$\lambda$: wavelength of photon $\Omega$: solid angle

Example 1

Fabrication of Organic EL Device

A grass substrate of 25 mm by 75 mm by 1.1 mm thick with an ITO transparent electrode (anode) (GEOMATEC CO., LTD.) (thickness of ITO was 130 nm) was subjected to ultrasonic cleaning with isopropyl alcohol for 5 minutes, and cleaned with ultraviolet rays and ozone for 30 minutes. The resultant substrate with transparent electrode lines was mounted on a substrate holder in a vacuum deposition device. First, an HI film was formed in a thickness of 60 nm so as to cover the surface of the transparence electrode on which the transparence electrode lines were formed. This HI film functioned as a hole-injecting layer. After forming the HI film, an HT film was formed in a thickness of 15 nm on the HI film. This HT film functioned as a hole-transporting layer.

Following the formation of the HT film, RH (Eg: 2.4 eV) and RD were deposited to a thickness of 5 nm to form a first emitting layer (Ip/Af [eV]=5.6/3.2) such that the concentration of RD was 0.5 wt %. The first emitting layer emits red light. Next, as a carrier barrier layer, an HT film (Ip/Af [eV]=5.36/2.3) was formed in a thickness of 5 nm. BH and BD were deposited to a thickness of 40 nm to form a blue emitting layer (second emitting layer) (Ip/Af [eV]=5.8/2.8) thereon such that the concentration of BD was 7.5 wt %. As an electron-transporting layer, a 20 nm thick tris(8-quinolinol) aluminum film (Alq₃ film) was formed thereon. Thereafter, an LiF film was formed in a thickness of 1.6 nm as an electron-injecting layer and metal Al was deposited in a thickness of 150 nm as a metal cathode, thereby fabricating an organic EL device.

(Evaluation of Organic EL Device)

Figure 6:
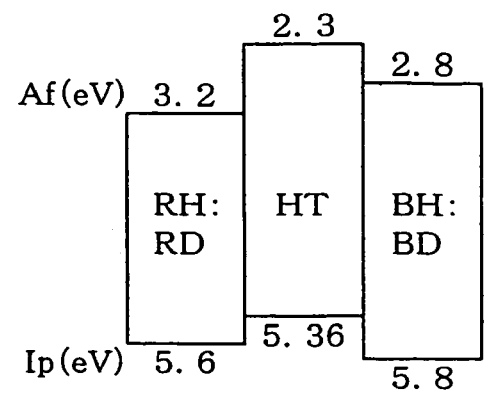
FIG. 6 is a view showing the energy levels of a first emitting layer, first carrier barrier layer, and second emitting layer formed in Example 1.

The energy levels of the first emitting layer, first carrier barrier layer and the second emitting layer formed in Example 1 are shown in FIG. 6. The properties of the organic EL device obtained were measured. The results were shown in Table 1.

Comparative Example 1

An organic EL device was fabricated in the same way as in Example 1 except that after forming the first emitting layer, the carrier barrier layer was not formed. The organic EL device obtained was measured in the same way as in Example 1. The results were shown in Table 1.

Comparative Example 2

An organic EL device was fabricated in the same way as in Comparative Example 1 except that the thickness of the hole transporting layer was changed to 10 nm, the thickness of the first emitting layer was changed to 40 nm, the thickness of the electron transporting layer was changed to 30 nm and the second emitting layer was not formed. The organic EL device obtained was measured in the same way as in Example 1. The results were shown in Table 1.

Comparative Example 3

An organic EL device was fabricated in the same way as in Comparative Example 1 except that the thickness of the hole transporting layer was changed to 20 nm, the thickness of the second emitting layer was changed to 40 nm and the first emitting layer was not formed. The organic EL device obtained was measured in the same way as in Example 1. The results were shown in Table 1.

Comparative Example 4

Figure 7:
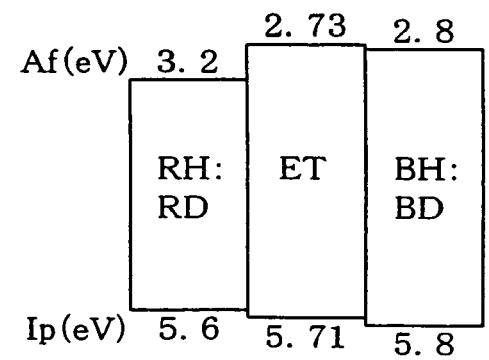
FIG. 7 is a view showing the energy levels of a first emitting layer, first carrier barrier layer, and second emitting layer formed in Comparative Example 4.

An organic EL apparatus was fabricated in the same way as in Example 1 except that as the carrier barrier layer, an ET film (Ip/Af [eV]=5.71/2.73) was formed instead of the HT film in a thickness of 5 nm. FIG. 7 shows the energy levels of the first emitting layer, first carrier barrier layer, and second emitting layer formed in Comparative Example 4. The organic EL device obtained was measured in the same way as in Example 1. The results were shown in Table 1.

Example 2

An organic EL device was fabricated in the same way as in Example 1 except that after forming the second emitting layer in a thickness of 10 nm, as a third emitting layer, BH and GD were deposited to a thickness of 30 nm to form a green emitting layer (Ip/Af [eV]=5.8/2.8) such that the concentration of GD was 10 wt % and then the Alq$_3$ layer (electron transporting layer) was formed. The organic EL device obtained was measured in the same way as in Example 1. The results were shown in Table 1.

Comparative Example 5

Figure 8:
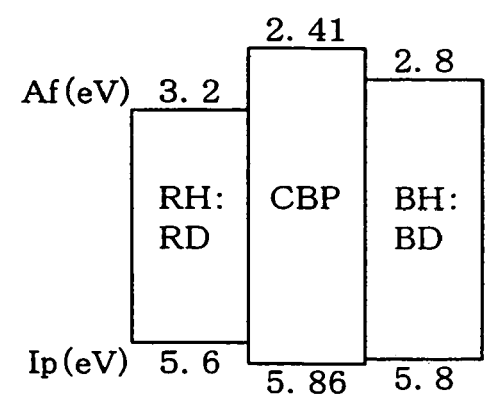
FIG. 8 is a view showing the energy levels of a first emitting layer, first carrier barrier layer, and second emitting layer formed in Comparative Example 5.

An organic EL device was fabricated in the same way as in Example 2 except that as the carrier barrier layer, a CBP film (Ip/Af [eV]=5.86/2.41) was formed instead of the HT film in a thickness of 5 nm. FIG. 8 shows the energy levels of the first emitting layer, first carrier barrier layer, and second emitting layer formed in Comparative Example 5. The organic EL apparatus obtained was measured in the same way as in Example 1. The results were shown in Table 1.

Example 3

An organic EL device was fabricated in the same way as in Example 1 except that as the carrier barrier layer, HT and GD were deposited instead of HT to form a layer (Ip/Af [eV]=5.36/2.3) such that the concentration of GD was 10 wt %, and the thickness of the second emitting layer was changed to 40 nm.

The organic EL device obtained was measured in the same way as in Example 1. The results were shown in Table 1.

Example 4

An organic EL device was fabricated in the same way as in Example 2 except that as the carrier barrier layer, HT and GD was deposited instead of HT to form a layer (Ip/Af [eV]=5.36/2.3) such that the concentration of GD was 5 wt %, the thickness of the second emitting layer was changed to 15 nm and the thickness of the third emitting layer was changed to 25 nm.

The organic EL device obtained was measured in the same way as in Example 1. The results were shown in Table 1.

Example 5

An organic EL device was fabricated in the same way as in Example 2 except that after forming the second emitting layer, as the carrier barrier layer, the HT film was formed in a thickness of 5 nm and then the third emitting layer was formed. The organic EL device obtained was measured in the same way as in Example 1. The results were shown in Table 1.

TABLE 1

| | First emitting layer Ip/Af(eV) | First carrier barrier layer Ip/Af(eV) | Second emitting layer Ip/Af(eV) | Second carrier barrier layer Ip/Af(eV) | Third emitting layer Ip/Af(eV) | Voltage V | Chromaticity x | Chromaticity y | L/J cd/A | External quantum efficiency % |
|---|---|---|---|---|---|---|---|---|---|---|
| Example 1 | RH:RD 5.6/3.2 | HT 5.36/2.3 | BH:BD 5.8/2.8 | — | — | 7.2 | 0.27 | 0.26 | 11.6 | 7.6 |
| Comparative example 1 | RH:RD 5.6/3.2 | — | BH:BD 5.8/2.8 | — | — | 7.6 | 0.50 | 0.31 | 10.4 | 8.0 |
| Comparative example 2 | RH:RD 5.6/3.2 | — | — | — | — | 5.2 | 0.65 | 0.34 | 8.2 | 6.4 |
| Comparative example 3 | — | — | BH:BD 5.8/2.8 | — | — | 7.2 | 0.14 | 0.19 | 8.8 | 6.3 |
| Comparative example 4 | RH:RD 5.6/3.2 | ET 5.71/2.73 | BH:BD 5.8/2.8 | — | — | 7.8 | 0.55 | 0.32 | 7.4 | 5.8 |
| Example 2 | RH:RD 5.6/3.2 | HT 5.36/2.3 | BH:BD 5.8/2.8 | — | BH:GD 5.8/2.8 | 7.3 | 0.32 | 0.39 | 16.7 | 7.7 |
| Comparative example 5 | RH:RD 5.6/3.2 | CBP 5.86/2.41 | BH:BD 5.8/2.8 | — | BH:GD 5.8/2.8 | 7.5 | 0.45 | 0.43 | 15 | 7.1 |
| Example 3 | RH:RD 5.6/3.2 | HT:GD 5.36/2.3 | BH:BD 5.8/2.8 | — | — | 6.9 | 0.32 | 0.33 | 14 | 7.8 |

TABLE 1-continued

| | First emitting layer Ip/Af(eV) | First carrier barrier layer Ip/Af(eV) | Second emitting layer Ip/Af(eV) | Second carrier barrier layer Ip/Af(eV) | Third emitting layer Ip/Af(eV) | Voltage V | Chromaticity x | Chromaticity y | L/J cd/A | External quantum efficiency % |
|---|---|---|---|---|---|---|---|---|---|---|
| Example 4 | RH:RD 5.6/3.2 | HT:GD 5.36/2.3 | BH:BD 5.8/2.8 | — | BH:GD 5.8/2.8 | 7.1 | 0.35 | 0.41 | 16.6 | 7.5 |
| Example 5 | RH:RD 5.6/3.2 | HT 5.36/2.3 | BH:BD 5.8/2.8 | HT 5.36/2.3 | BH:GD 5.8/2.8 | 8.9 | 0.33 | 0.56 | 19.7 | 6 |

In Example 1, the red emission of Comparative example 2 and the blue emission of Comparative example 3 were combined. A red emitting layer with a small energy gap was used as the first emitting layer on the anode side, a blue emitting layer with a large energy gap was used as the second emitting layer, and a carrier barrier layer with a small affinity level was provided therebetween. As a result, excellent white emission could be obtained whose external quantum efficiency was higher than those of individual colors (FIG. 6).

In Example 2, the addition of a green emitting layer as the third emitting layer to the device of Example 1 gave excellent white emission with a similar external quantum efficiency and higher luminance efficiency.

In Example 3, doping the carrier barrier layer of Example 1 with a green emission material gave excellent white emission with a similar external quantum efficiency.

In Comparative example 4, since the electron transporting layer with a large affinity level was provided, red became strong and the efficiency was reduced (FIG. 7).

In Comparative example 5, since the layer with a large ionization potential and small affinity level was provided, holes remained in the first emitting layer so that red became strong compared to Example 2 and excellent white emission could not be obtained (FIG. 8).

Figure 9:
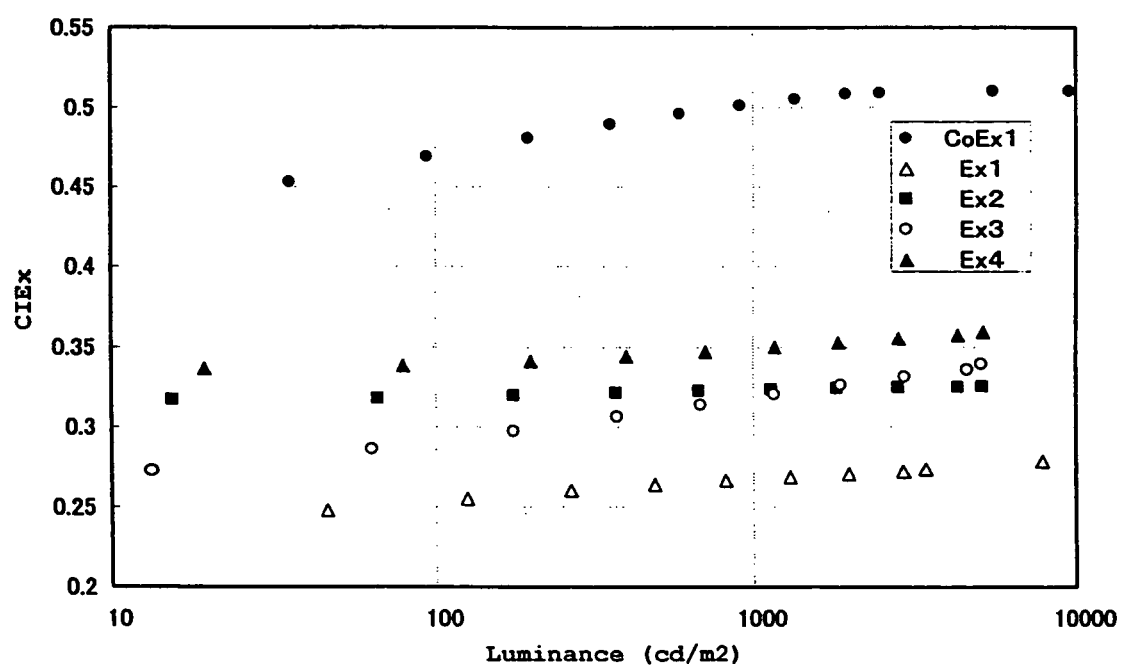
FIG. 9 is a view showing the CIE1931 chromaticity coordinate x for the luminance of organic EL devices fabricated in Comparative Example 1 and Examples 1 to 4.
Figure 10:
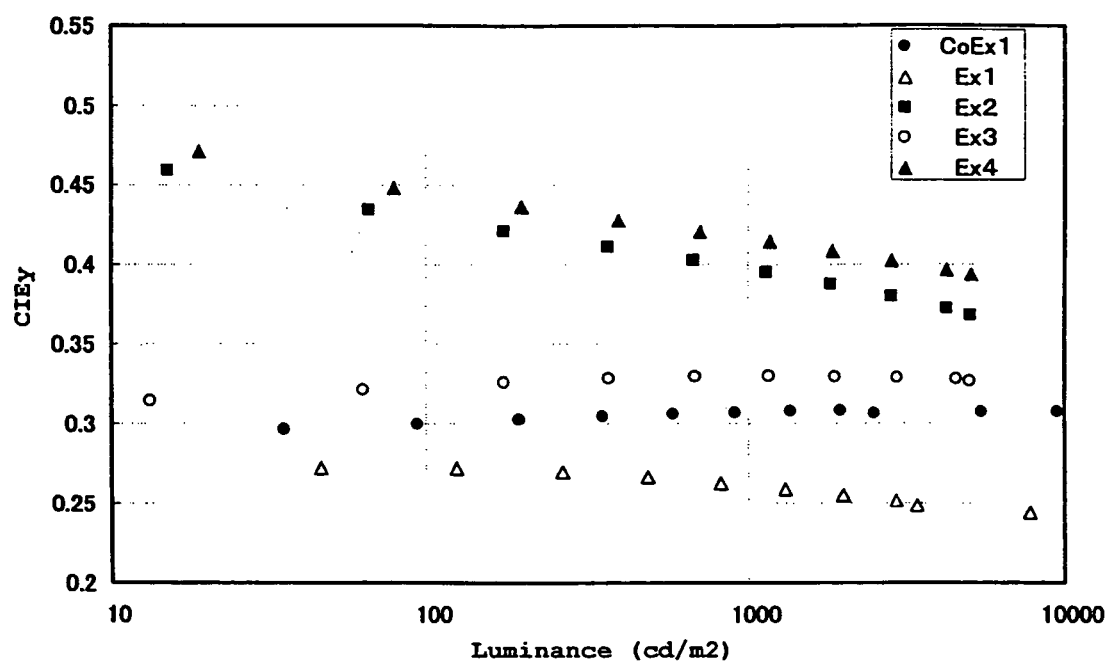
FIG. 10 is a view showing the CIE1931 chromaticity coordinate y for the luminance of organic EL devices fabricated in Comparative Example 1 and Examples 1 to 4.

In Comparative example 1, the CIE1931 chromaticity (x, y) was significantly apart from white (0.33, 0.33) in the luminance range of 10 to 10000 cd/m$^2$ so that red became strong and excellent white emission could not be obtained. In Examples 1 to 4, the chromaticity (x, y) was close to white and excellent white emission was obtained. In particular, in Example 3, a change in chromaticity (x, y) in the luminance range of 10 to 10000 cd/m$^2$ was smaller than those in Examples 1 to 2 and 4 and more excellent white emission could be obtained (FIGS. 9 and 10).

INDUSTRIAL APPLICABILITY

The organic EL device of the invention can be used for various displays, backlight, full-color displays with color filters, and light sources for general and special lighting.

What is claimed is:

1. An organic electroluminescent device comprising:
an anode, a first emitting layer, a carrier barrier layer, a second emitting layer, and a cathode stacked in that order;
the first emitting layer being formed of a hole transporting material, and the second emitting layer being formed of an electron transporting material;
the affinity level of the carrier barrier layer being smaller than the affinity level of the second emitting layer in an amount of 0.2 eV or more; and
the ionization potential (Ie1) of the carrier barrier layer and the ionization potential (Ih1) of the first emitting layer satisfying Ie1<Ih1+0.1 (eV) (1),
wherein
the energy gap of the first emitting layer is from 1.8 to 2.8 eV and the energy gap of the second emitting layer is from 2.2 to 3.3 eV.

2. The organic electroluminescent device according to claim 1, wherein the energy gap of the first emitting layer is smaller than the energy gap of the second emitting layer in an amount of 0.4 eV or more.

3. The organic electroluminescent device according to claim 1, wherein the carrier barrier layer includes an emitting material.

4. The organic electroluminescent device according to claim 1, further comprising a hole transporting layer adjacent to the first emitting layer between the anode and the first emitting layer.

5. The organic electroluminescent device according to claim 1, wherein the first emitting layer or a first organic layer which is the organic layer closer to the anode comprises an oxidizing agent and/or the second emitting layer or a second organic layer which is the organic layer closer to the cathode comprises a reducing agent.

6. The organic electroluminescent device according to claim 4, wherein a material forming the hole transporting layer is the same as a material forming the carrier barrier layer.

7. An organic electroluminescent device comprising:
an anode, a first emitting layer, a carrier barrier layer, a second emitting layer, a third emitting layer, and a cathode stacked in that order;
the first emitting layer being formed of a hole transporting material, and the second emitting layer and the third emitting layer being formed of electron transporting materials;
and the ionization potential (Ie1) of the carrier barrier layer and the ionization potential (Ih1) of the first emitting layer satisfying the relationship Ie1<Ih1+0.1 (eV) (1),
wherein the third emitting layer and the carrier barrier layer are different layers.

8. The organic electroluminescent device according to claim 7, wherein the affinity level of the carrier barrier layer is smaller than the affinity level of the second emitting layer in an amount of 0.2 eV or more.

9. The organic electroluminescent device according to claim 7, wherein the energy gap of the first emitting layer is smaller than the energy gap of the second emitting layer in an amount of 0.4 eV or more.

10. The organic electroluminescent device according to claim 7, wherein the carrier barrier layer comprises an emitting material.

11. The organic electroluminescent device according to claim 7, further comprising a hole transporting layer adjacent to the first emitting layer between the anode and the first emitting layer.

12. The organic electroluminescent device according to claim 7, wherein the first emitting layer or a first organic layer which is the organic layer closer to the anode comprises an oxidizing agent and/or the second emitting layer or a second organic layer which is the organic layer closer to the cathode comprises a reducing agent.

13. The organic electroluminescent device according to claim 7, wherein the energy gap of the first emitting layer is from 1.8 to 2.8 eV and the energy gap of the second emitting layer is from 2.2 to 3.3 eV.

14. The organic electroluminescent device according to claim 11, wherein a material forming the hole transporting layer is the same as a material forming the carrier barrier layer.

15. An organic electroluminescent device comprising:
an anode, a first emitting layer, a first carrier barrier layer, a second emitting layer, a second carrier barrier layer, a third emitting layer, and a cathode stacked in that order;
the first emitting layer being formed of a hole transporting material, and the second emitting layer and the third emitting layer being formed of electron transporting materials; and
the ionization potential (Ie1) of the first carrier barrier layer and the ionization potential (Ih1) of the first emitting layer satisfying Ie1<Ih1+0.1 (eV) (1),
wherein the third emitting layer and the carrier barrier layer are different layers.

16. The organic electroluminescent device according to claim 15, wherein the affinity level of the first carrier barrier layer is smaller than the affinity level of the second emitting layer in an amount of 0.2 eV or more, and the affinity level of the second carrier barrier layer is smaller than the affinity level of the third emitting layer in an amount of 0.2 eV or more.

17. The organic electroluminescent device according to claim 15, wherein the energy gap of the first emitting layer is smaller than the energy gap of the second emitting layer in an amount of 0.4 eV or more.

18. The organic electroluminescent device according to claim 15, wherein at least one of the first carrier barrier layer and the second carrier barrier layer comprises an emitting material.

19. The organic electroluminescent device according to claim 15, further comprising a hole transporting layer adjacent to the first emitting layer between the anode and the first emitting layer.

20. The organic electroluminescent device according to claim 15, wherein the first emitting layer or a first organic layer which is the organic layer closer to the anode comprises an oxidizing agent and/or the second emitting layer or a second organic layer which is the organic layer closer to the cathode comprises a reducing agent.

21. The organic electroluminescent device according to claim 15, wherein the energy gap of the first emitting layer is from 1.8 to 2.8 eV and the energy gap of the second emitting layer is from 2.2 to 3.3 eV.

22. The organic electroluminescent device according to claim 15, wherein the second emitting layer is located between the first carrier barrier layer and the second carrier barrier layer.

23. The organic electroluminescent device according to claim 19, wherein a material forming the hole transporting layer is the same as a material forming at least one of the first carrier barrier layer and the second carrier barrier layer.

* * * * *